(12) United States Patent
Peng et al.

(10) Patent No.: US 11,038,738 B2
(45) Date of Patent: Jun. 15, 2021

(54) ENCODING METHOD AND ENCODER FOR (N,N(N-1),N-1) PERMUTATION GROUP CODE IN COMMUNICATION MODULATION SYSTEM

(71) Applicant: HUAZHONG UNIVERSITY OF SCIENCE AND TECHNOLOGY, Hubei (CN)

(72) Inventors: Li Peng, Hubei (CN); Si Jia Chen, Hubei (CN); Ying Long Shi, Hubei (CN); Ya Yu Gao, Hubei (CN); Bin Dai, Hubei (CN); Lin Zhang, Hubei (CN); Kun Liang, Hubei (CN); Bo Zhou, Hubei (CN); Zhen Qin, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 16/727,944

(22) Filed: Dec. 27, 2019

(65) Prior Publication Data

US 2020/0287774 A1    Sep. 10, 2020

(30) Foreign Application Priority Data

Mar. 6, 2019   (CN) .......................... 201910169263.8

(51) Int. Cl.
| | | |
|---|---|---|
| *H04L 27/36* | (2006.01) | |
| *H03M 7/30* | (2006.01) | |
| *H03M 7/40* | (2006.01) | |

(52) U.S. Cl.
CPC .......... *H04L 27/36* (2013.01); *H03M 7/4012* (2013.01); *H03M 7/6011* (2013.01)

(58) Field of Classification Search
CPC ............ H03M 5/04; H03M 5/12; H03M 5/16; H03M 7/02; H03M 7/14; H03M 7/40; H03M 7/4012; H03M 7/6011; H04L 27/36
(Continued)

(56) References Cited

U.S. PATENT DOCUMENTS

| | | | | |
|---|---|---|---|---|
| 5,870,414 A | * | 2/1999 | Chaib ................. | H03M 13/251 714/755 |
| 2011/0296274 A1 | * | 12/2011 | Mittelholzer ....... | G06F 11/1072 714/755 |

(Continued)

*Primary Examiner* — Young T. Tse
(74) *Attorney, Agent, or Firm* — JCIPRNET

(57) ABSTRACT

The present disclosure provides an encoding method and an encoder for a (n, n(n-1), n-1) permutation group code in a communication modulation system, in which $2^k$ k-length binary information sequences are mapped to $2^k$ n-length permutation codeword signal points in a n-dimensional modulation constellation $\Gamma_n$. The constellation $\Gamma_n$ with the coset characteristics is formed by selecting $2^k$ n-length permutation codewords from n(n-1) permutation codewords of a code set $P_{n,x_i}$ of the (n, n(n-1), n-1) permutation group code based on coset partition. The constellation $\Gamma_n$ is a coset code in which $2^{k_1}$ cosets are included and each coset includes $2^{k_2}$ permutation codewords, where $k=k_1+k_2$, and $2^k \leq n(n-1)$. The present disclosure utilizes the coset characteristics to realize one-to-one correspondence mapping of the binary information sequence set to the permutation code constellation, so that the time complexity of executing the encoder is at most the linear complexity of the code length n.

7 Claims, 7 Drawing Sheets

(58) Field of Classification Search
USPC .............. 375/241, 242, 246, 253, 265, 295;
341/51–53, 55–59, 67, 70, 76, 95, 143
See application file for complete search history.

(56) References Cited

U.S. PATENT DOCUMENTS

| | | | |
|---|---|---|---|
| 2012/0121084 A1* | 5/2012 | Tomlinson | .............. H04L 9/304 |
| | | | 380/30 |
| 2016/0373200 A1* | 12/2016 | Ulrich | ................. H04L 27/2602 |
| 2019/0158222 A1* | 5/2019 | Kurmaev | .......... H03M 13/6362 |

* cited by examiner

ACCOMPANYING FIGURES

| 12345 0000 | 24135 0100 | 31425 1000 | 43215 1100 |
| 23451 0001 | 35241 0101 | 42531 1001 | 54321 1101 |
| 34512 0010 | 41352 0110 | 53142 1010 | 15432 1110 |
| 45123 0011 | 52413 0111 | 14253 1011 | 21543 1111 |
| 51234 | 13524 | 25314 | 32154 |

ENCODING METHOD AND ENCODER FOR (N,N(N-1),N-1) PERMUTATION GROUP CODE IN COMMUNICATION MODULATION SYSTEM

CROSS-REFERENCE TO RELATED APPLICATION

This application claims the priority benefit of China application serial no. 201910169263.8, filed on Mar. 6, 2019. The entirety of the above-mentioned patent application is hereby incorporated by reference herein and made a part of this specification.

TECHNICAL FIELD

The present disclosure relates to a technical field of channel coding modulation in communication transmission, and more particularly to an encoding method and an encoder for a (n, n(n−1), n−1) permutation group code (PGC) in a communication modulation system.

DESCRIPTION OF THE RELATED ART

In the wireless signal transmission in multi-user communication, there are not only multipath fading, but also multi-user interference. The CDMA-based multiple access scheme in the 3G mobile communication and the OFDM-based multiple access scheme in the 4G mobile communication both has the strong capability for resisting multipath fading and multi-user interference, but feature a large system delay, which is difficult to meet the needs of the 5G in specific application areas. To this end, a multi-access coding modulation scheme with ultra-low delay and ultra-reliable reliability is proposed. The basic principle of the scheme is that a (n, n(n−1), n−1) permutation group code is utilized to control the carrying signal, and in this process, time diversity and frequency diversity are introduced at the same time, so that the system still has the strong capability for resisting multipath fading and multi-user interference in a case of performing a reduced-complexity operation.

A patent application entitled "CONSTRUCTION METHOD FOR (n, n(n−1), n−1) PERMUTATION GROUP CODE BASED ON COSET PARTITION AND CODEBOOK GENERATOR THEREOF" was filed in the China National Intellectual Property Administration (CNIPA) on Jan. 27, 2016 with the application No.: 201610051144.9. In addition, a patent application entitled "CONSTRUCTION METHOD FOR (n, n(n−1), n−1) PERMUTATION GROUP CODE BASED ON COSET PARTITION AND CODEBOOK GENERATOR THEREOF" was filed in the United States Patent and Trademark Office (USTPO) with the application Ser. No.: 15/060,111, and has been granted patent right.

As far as the current research status is concerned, there is no effective mapping encoding algorithm for the permutation group code and specific executable scheme for the corresponding encoder in the PGC-MFSK coded modulation transceiver system. In particular, due to the lack of algebraic encoding and decoding schemes for the permutation code, a random permutation code is used in most of the research results on permutation code applications.

SUMMARY

In view of the algebraic structure of the (n, n(n−1), n−1) permutation group code based on coset partition, the present disclosure discloses an encoding method and an encoder for a (n, n(n−1), n−1) permutation group code based on coset partition in a communication modulation system, in which a k-length binary information sequence is mapped to a codeword in the (n, n(n−1), n−1) permutation group code, and a set of $2^k$ k-length binary information sequences is mapped to a code set of a permutation group code with a code length of n, a minimum distance of n−1, a cardinality of n(n−1) and an error-correcting capability of d−1=n−2, where $2^k \leq n(n-1)$. This requires that $2^k$ codewords are selected from the n(n−1) codewords of the code set of the permutation group code to match the $2^k$ k-length binary information sequences one by one. Since the (n, n(n−1), n−1) permutation group code has the coset partition structure characteristics, an encoding method and an encoder for the coset structure can be designed to form a time-diversity and frequency-diversity channel access technology with ultra-low delay.

In order to achieve the above objective, according to an aspect of the present disclosure, there is provided an encoding method for a (n, n(n−1), n−1) permutation group code in a communication modulation system, wherein the encoding method maps a k-length binary information sequence to a n-length permutation codeword in a signal constellation formed by a (n, n(n−1), n−1) permutation group code based on coset partition, and comprises the following steps.

Step 1: constructing a (n, n(n−1), n−1) permutation group code, wherein when n is a prime number, the (n, n(n−1), n−1) permutation group code contains n(n−1) permutation codewords, each permutation codeword contains n code elements, a minimum Hamming distance between any two permutation codewords is n−1, and a code set $P_{n,x_i}$ of the (n, n(n−1), n−1) permutation group code is obtained by following expressions:

$$P_{n,x_i} = C_n L_{n,x_i} = \{c_i \circ l_j \mid c_i \in C_n, l_j \in L_{n,x_i}, i \in Z_n, j \in Z_{n-1}\} \quad (1)$$

$$= \{(t_{rn})^{n-1} L_{n,x_i}\} = \{(t_{l1})^{n-1} L_{n,x_i}\} \quad (2)$$

where $P_{n,x_i}$ is obtained by an operator "∘" composition operation of a special cyclic subgroup $C_n$ with a cardinality of $|C_n|=n$ and a largest single fixed point subgroup $L_{n,x_i}$, $c_i$ represents an element in $C_n$, $l_j$ represents an element in $L_{n,x_i}$, $Z_n$ represents a positive integer finite domain expressed by $Z_n=\{1,2,\ldots,n\}$, $Z_{n-1}$ represents a positive integer finite domain expressed by $Z_{n-1}=\{1,2,\ldots,n-1\}$, and the code set $P_{n,x_i}$ has a cardinality of $|P_{n,x_i}|=n(n-1)$.

The largest single fixed point subgroup $L_{n,x_i}$ is obtained by an expression (3):

$$L_{n,x_i} = \{a(l_{1,x_i} - x_i) + x_i \mid a \in Z_{n-1}, x_i \in Z_n, l_{1,x_1} = [1 \ldots n]\} \quad (3)$$

where when n is a prime number, the largest single fixed point subgroup has a cardinality of $|L_{n,x_i}|=n-1$; $x_i \in Z_n$ indicates that the i-th code element of each of all n−1 permutation codewords in $L_{n,x_i}$ is a fixed point, and the other code elements are non-fixed points; and for $x_i = i$ and $x_i$, $i \in Z_n$, there are n fixed points in all, respectively corresponding to n largest single fixed point subgroups $L_{n,1}, L_{n,2}, \ldots, L_{n,n}$.

$P_{n,x_i} = C_n L_{n,x_i}$ indicates that the code set $P_{n,x_i}$ is composed of n−1 cosets $C_n l_{1,x_i}, C_n l_{2,x_i}, \ldots, C_n l_{n-1,x_i}$ of $C_n$; in the expression (2), $C_n$ is replaced by a cyclic-right-shift operator function $(t_{rn})^{n-1}$ or a cyclic-left-shift operator function $(t_{l1})^{n-1}$ to act on $L_{n,x_i}$, so that the n−1 cosets of $C_n$ are equivalently expressed as n−1 cyclic-left-shift orbits $\{(t_{l1})^{n-1}1_{1,x_i}\}, \{(t_{l1})^{n-1}1_{2,x_i}\}, \ldots, \{(t_{l1})^{n-1}1_{n-1,x_i}\}$ or cyclic-right-shift orbits $\{(t_{rn})^{n-1}1_{1,x_i}\}, \{(t_{rn})^{n-1}1_{2,x_i}\}, \ldots, \{(t_{rn})^{n-1}1_{n-1,x_i}\}$.

For an equivalent operation of $\{(t_{rn})^{n-1}L_{n,x_i}\}$ and $\{(t_{l1})^{n-1}L_{n,x_i}\}$, a coset leader or orbit leader array composed of n−1 permutation codewords is first calculated by the expression (3) for calculating $L_{n,x_i}$, and then all n(n−1) codewords of the code set $P_{n,x_i}$ are calculated by the expression (2); for each orbit, a permutation codeword $1_{j,x_i}$ of $L_{n,x_i}$ is input to a cyclic shift register to perform n−1 cyclic-left-shift operations, equivalent to performing $\{(t_{l1})^{n-1}1_{j,x_i}\}$, or to perform n−1 cyclic-right-shift operations, equivalent to performing $\{(t_{rn})^{n-1}1_{j,x_i}\}$, thereby generating n permutation codewords; and n(n−1) permutation codewords are generated by n−1 orbits.

Step 2: selecting $2^k$ permutation codewords from the n(n−1) permutation codewords of the code set $P_{n,x_i}$ to form a signal constellation $\Gamma_n$ such that $\Gamma_n$ still has coset characteristics, that is, $\Gamma_n$ contains the $2^k$ permutation codewords, and is partitioned into $2^{k_1}$ cosets, and each coset contains $2^{k_2}$ permutation codewords, where $k=k_1+k_2$, $2^k \leq n(n-1)$, $2^{k_1} \leq n-1$, $2^{k_2} \leq n$, and an exact value of k is $k=\lfloor \log_2 n(n-1) \rfloor$.

Step 3: defining a mapping function $\varphi: H_k \to \Gamma_n$ by a function $\pi=\varphi(h)$, and mapping, by the mapping function $\varphi$, a k-length binary information sequence $h=[h_1 h_2 \ldots h_k]$ in a set $H_k$ of $2^k$ k-length binary information sequences to a signal point $\pi=[a_1 a_2 \ldots a_n]$ in the signal constellation $\Gamma_n$ composed of the $2^k$ n-length permutation codewords, where $\pi \in \Gamma_n$, $h \in H_k$, $h_1, h_2, \ldots, h_k \in Z_2 = \{0,1\}$, and $a_1, a_2, \ldots, a_n \in Z_n$.

In an alternative embodiment, the signal constellation $\Gamma_n$ with the coset characteristics constitutes a coset code, and the step 2 specifically includes the following.

For any prime number n>1, the code set $P_{n,x_i}$ is a subgroup of a symmetric group $S_n$, and all permutation codewords of $P_{n,x_i}$ are positive integer vectors, which are regarded as discrete lattice points in an n-dimensional real Euclidean space $\Re^n$; all valid signal points of the signal constellation $\Gamma_n$ are selected from the subgroup $P_{n,x_i}$ or finite lattice $P_{n,x_i}$ of the symmetric group $S_n$; $\Gamma_n$ has a cardinality of $|\Gamma_n|=|H_k|=2^k$, and has the same coset structure as $P_{n,x_i}$ and cosets of $\Gamma_n$ have the same size, which is smaller than that of $P_{n,x_i}$.

For a sub-lattice or sub-group $C_n$ of the code set $P_{n,x_i}$, i.e., a subset of n(n−1) permutation codewords of $P_{n,x_i}$, the sub-lattice $C_n$ itself is an n-dimensional lattice or a set of n-dimensional permutation vectors each containing n permutation codewords, and induces a partition $P_{n,x_i}/C_n$ of $P_{n,x_i}$, which partitions $P_{n,x_i}$ into $|P_{n,x_i}/C_n|$ cosets of $C_n$, where $|P_{n,x_i}/C_n|=|L_{n,x_i}|=n-1$; in the signal constellation $\Gamma_n \in P_{n,x_i}$, when a coset of $C_n$ and a lattice point of the coset are respectively indexed by two binary information sequences, the order of this partition is expressed as a power of 2, the number of cosets of this division is $2^{k_1}$, and each coset is indexed by a $k_1$-length information sequence; in each coset, the number of valid lattice points is also a power of 2, then the number of signal points contained in each coset is $2^{k_2}$, and each signal point in each coset is indexed by a $k_2$-length information sequence, where $k=k_1+k_2$.

The step 3 specifically includes the following.

The k-length binary information sequence is separated into two independent binary information sequences: a $k_1$-length information sequence corresponding to high-level $k_1$-bit of the k-length binary information sequence, and a $k_2$-length information sequence corresponding to low-level $k_2$-bit of the k-length binary information sequence; the $k_1$-length information sequence is used for indexing a coset in $|P_{n,x_i}/C_n|=|L_{n,x_i}|=n-1$ cosets, that is, for selecting a coset in the $2^{k_1}=n-1$ cosets in $\Gamma_n$; the $k_2$-length information sequence is used for indexing a codeword in the selected coset, that is, for selecting a codeword in the $2^{k_2} \leq n$ codewords of the selected coset to be transmitted to a channel, thereby obtaining one-to-one mapping numberings between the $2^k$ k-length binary information sequences and the $2^k$ n-length permutation codewords of the signal constellation $\Gamma_n$.

In accordance with another aspect of the present disclosure, there is further provided an encoder for a (n, n(n−1), n−1) permutation group code in a communication modulation system, wherein the encoder maps a k-length binary information sequence to a n-length permutation codeword in a signal constellation formed by a (n, n(n−1), n−1) permutation group code based on coset partition, the encoder comprises a k-length information sequence splitter (also called a bit splitter) D, a coset selector and an intra-coset permutation codeword selector.

The k-length information sequence splitter D is configured to inputs a k-length binary information sequence and output two information sequences: a $k_1$-length information sequence corresponding to high-level $k_1$-bit of the input k-length binary information sequence, and a $k_2$-length information sequence corresponding to low-level $k_2$-bit of the input k-length binary information sequence, where $k=k_1+k_2$.

The coset selector is configured to select a coset by taking $k_1$-length information sequences as indices of n−1 cosets, in which $2^{k_1}$ $k_1$-length information sequences respectively correspond to $2^{k_1}$ binary index labels for the cosets, $2^{k_1} \leq n-1$, and each binary index label is used for selecting a coset from $2^{k_1}$ cosets; when n is a prime number, $2^{k_1}=n-1$; the cosets are as follows: $2^k$ permutation codewords are selected from n(n−1) permutation codewords of a code set $P_{n,x_i}$ to form a signal constellation $\Gamma_n$ such that $\Gamma_n$ still has coset characteristics, that is, $\Gamma_n$ contains $2^k$ permutation codewords, and is partitioned into $2^{k_1}$ cosets, and each coset contains $2^{k_2}$ permutation codewords, where $k=k_1+k_2$, $2^k \leq n(n-1)$, $2^{k_1} \leq n-1$, $2^{k_2} \leq n$, and an exact value of k is $k=\lfloor \log_2 n(n-1) \rfloor$.

The intra-coset permutation codeword selector is configured to select a permutation codeword by taking $k_2$-length information sequences as indices of n permutation codewords in the selected coset, in which the $2^{k_2}$ $k_2$-length information sequences respectively correspond to $2^{k_2}$ binary index labels for the n permutation codewords in the selected coset, $2^{k_2} \leq n$ and each binary index label is used for selecting a permutation codeword from $2^{k_2}$ permutation codewords in the selected coset; when n is a prime number, $2^{k_2}$ permutation codewords are selected from n permutation codewords in a coset of $C_n$ as needed to form a coset of the constellation $\Gamma_n$, that is, any $n-2^{k_2}$ permutation codewords are required to be discarded in each coset of $C_n$.

In an alternative embodiment, the encoder is one of the following three encoders: a $U_1$-$V_1$ type encoder with all permutation codewords of the constellation $\Gamma_n$ stored in an n-dimensional read only memory (ROM), a $U_1$-$V_2$ type encoder with a part of permutation codewords of the constellation $\Gamma_n$ stored in an n-dimensional ROM, and a $U_2$-$V_2$ type encoder with the constellation $\Gamma_n$ independent of an n-dimensional ROM, wherein $U_1$ and $U_2$ represent two different types of coset selectors, and $V_1$ and $V_2$ represent two different types of intra-coset permutation codeword selectors.

In a case where the coset selector is a $U_1$ type coset selector, the coset selector includes two parts: an address generator of mapping a $k_1$-length information sequence to a coset leader permutation codeword, in which when $k_1$ is input, an address in a n-dimensional ROM is output; and a storage structure of $2^{k_1}$ coset leader permutation codewords in the n-dimensional ROM.

In a case where the coset selector is a $U_2$ type coset selector, the coset selector includes two parts: a mapper of mapping a $k_1$-length information sequence to a parameter a; and a coset leader permutation codeword generator.

In a case where the intra-coset permutation codeword selector is a $V_1$ type intra-coset permutation codeword selector, the intra-coset permutation codeword selector includes two parts: an address generator of mapping a $k_2$-length information sequence to an intra-coset permutation codeword, in which when $k_2$ is input, an address in an n-dimensional ROM is output; and a storage structure of $2^{k_2}$ intra-coset permutation codewords in the n-dimensional ROM.

In a case where the intra-coset permutation codeword selector is a $V_2$ type intra-coset permutation codeword selector, the intra-coset permutation codeword selector includes two parts: a decrement counter for $k_2$-length information sequence; and a cyclic shift register with two switches configured to perform a cyclic-left-shift or cyclic-right-shift operation.

In an alternative embodiment, the $U_1$-$V_1$ type encoder includes the k-length information sequence splitter D, the address generator of mapping the $k_1$-length information sequence to the coset leader permutation codeword, the address generator of mapping the $k_2$-length information sequence to the intra-coset permutation codeword, and a storage structure of all $2^k$ permutation codewords of the constellation $\Gamma_n$ in the n-dimensional ROM.

For a structure of the address generator of mapping the $k_1$-length information sequence to the coset leader permutation codeword, there is a one-to-one correspondence between $2^{k_1}$ $k_1$-length binary information sequences and coset leaders of respective cosets; each coset leader is determined by a largest single fixed point subgroup $L_{n,x_i}$, and $|L_{n,x_i}|$ coset leader permutation codewords are calculated by $L_{n,x_i} = \{a(1_{1,x_i} - x_i) + x_i | a \in Z_{n-1}, x_i \in Z_n, 1_{1,x_i} = [1 \ldots n]\}$; $2^{k_1}$ coset leader permutation codewords are selected from the $|L_{n,x_i}|$ coset leader permutation codewords to be stored in the n-dimensional ROM, and a storage address of each of the $2^{k_1}$ coset leader permutation codewords in the n-dimensional ROM is recorded, thereby forming the address generator; when n is a prime number, $|L_{n,x_i}| = n-1 = 2^{k_1}$; and the address generator of mapping the $k_1$-length information sequence to the coset leader permutation codeword inputs a $k_1$-length information sequence and outputs an address of a selected coset leader permutation codeword.

For a structure of the address generator of mapping the $k_2$-length information sequence to the intra-coset permutation codeword, a one-to-one correspondence between $2^{k_2}$ $k_2$-length information sequence and permutation codewords in each coset is established; $n-2^{k_2}$ permutation codewords are discarded in each coset of the code set $P_{n,x_i}$ to form the constellation $\Gamma_n$; $2^{k_2}$ permutation codewords of each coset of the constellation $\Gamma_n$ are sequentially stored in the n-dimensional ROM, with a storage address of the respective coset leader permutation codeword followed by storage addresses of the respective permutation codewords, and a mapping function between the $2^{k_2}$ $k_2$-length information sequence and storage addresses of the $2^{k_2}$ permutation codewords of each coset of the constellation $\Gamma_n$ in the n-dimensional ROM is established; and the address generator of mapping the $k_2$-length information sequence to the intra-coset permutation codeword inputs a $k_2$-length information sequence and outputs an address of a selected intra-coset permutation codeword.

For a storage structure of all $2^k$ permutation codewords of the constellation $\Gamma_n$ in the n-dimensional ROM, the constellation $\Gamma_n$ is partitioned into $2^{k_1}$ cosets, and each coset contains $2^{k_2}$ permutation codeword; each permutation codeword of the largest single fixed point subgroup is calculated, and a storage address of each coset leader permutation codeword in the n-dimensional ROM is determined; $2^{k_1}$ storage addresses are stored in a register of the address generator of mapping the $k_1$-length information sequence to the coset leader permutation codeword to select respective coset leader permutation codewords; when n is a prime number, $2^{k_1} = n-1$; $2^{k_2}$ permutation codewords in each coset are obtained by a cyclic-left-shift or cyclic-right-shift composition operator acting on each coset leader permutation codeword, that is, calculating a set $(t_{l1})^{n-1} L_{n,x_i}$ or $\{(t_m)^{n-1} L_{n,x_i}\}$, and stored in the n-dimensional ROM, with a storage address of the respective coset leader permutation codeword followed by storage addresses of the respective permutation codewords; and an address corresponding to the $k_2$-length information sequence is determined by the $k_2$-length information sequence itself and the address of the coset leader permutation codeword.

In an alternative embodiment, the $U_1$-$V_2$ type encoder includes the k-length information sequence splitter D, the address generator of mapping the $k_1$-length information sequence to the coset leader permutation codeword, the storage structure of the $2^{k_1}$ coset leader permutation codewords in the n-dimensional ROM, the decrement counter for the $k_2$-length information sequence, and the cyclic shift register with two switches.

For the storage structure of the $2^{k_1}$ coset leader permutation codewords in the n-dimensional ROM, when $2^{k_1}$ permutation codewords of $L_{n,x_i}$ are stored in the n-dimensional ROM, each line represents a storage word in the n-dimensional ROM, and each permutation codeword occupies a storage word; all $|L_{n,x_i}|$ coset leader permutation codewords are generated by $L_{n,x_i} = \{a(1_{1,x_i} - x_i) + x_i | a \in Z_{n-1}, x_i \in Z_n, 1_{1,x_i} = [1 \ldots n]\}$, and the $2^{k_1}$ permutation codewords are arbitrarily selected from the $|L_{n,x_i}|$ coset leader permutation codewords, and sequentially stored in the n-dimensional ROM in an order of $a=1,2, \ldots, |L_{n,x_i}|$; and in a case of a read control signal Rd=1, upon the arrival of a cp clock pulse, the n-dimensional ROM outputs a permutation codeword designated by an input address in parallel or serial.

For a structure of the decrement counter for the $k_2$-length information sequence, the decrement counter for the $k_2$-length information sequence inputs a $k_2$-length information sequence corresponding to low-level $k_2$-bit of the k-length information sequence, and the $k_2$-length information sequence is stored to a u cyclic shift register in the decrement counter to perform a cycle-minus-one operation; when u≠0, the decrement counter outputs a high-level signal to control a switch 1 to be closed and a switch 2 to be opened; and when u=0, the decrement counter outputs a low-level signal to control the switch 1 to be opened and the switch 2 to be closed; and the switch 1 is controlled to perform a cyclic shift operation of the cyclic shift register, and the switch 2 is controlled to perform a serial output operation of the cyclic shift register.

For the cyclic shift register, when the switch 1 is controlled to be closed, the cyclic shift register performs a cyclic-left-shift or cyclic-right-shift operation on a permutation codeword stored therein to obtain a new permutation codeword, and such cyclic shift operation is performed $k_2$ times, until u is decremented from u≠0 to u=0 through the cycle-minus-one operation, thereby forming a decoded codeword in the cyclic shift register; then the switch 1 is controlled to be opened, and the switch 2 is controlled to be closed, so as to serially output a decoded codeword.

For a working process of the $U_1$-$V_2$ type encoder with the part of permutation codewords of the constellation $\Gamma_n$ stored in the n-dimensional ROM, the information sequence splitter D inputs a k-length information sequence and partitions it into a $k_1$-length information sequence corresponding to high-level $k_1$-bit and a $k_2$-length information sequence corresponding to low-level $k_2$-bit; the $k_1$-information sequence is mapped to an address of a coset leader permutation codeword in the n-dimensional ROM, and the address generator outputs the address to select the coset leader permutation codeword; the selected coset leader permutation codeword is input in parallel from the n-dimensional ROM to the cyclic shift register through a system bus, and under the control of the decrement counter for the $k_2$-length information sequence, a high-level signal is output in a case of u≠0, so that the switch 1 is closed and the cyclic shift register performs a cyclic-left-shift or cyclic-right-shift operation; the cyclic-left-shift or cyclic-right-shift operation is performed once for each cycle-minus-one operation of the decrement counter, until u is decremented 0, and then a low-level signal is output, so that the switch 1 is opened, the switch 2 is closed, and the cyclic shift register stops the cyclic-left-shift or cyclic-right-shift operation, but performs a left-shift-output operation to serially output a decoded codeword.

In an alternative embodiment, the $U_2$-$V_2$ type encoder includes: the k-length information sequence splitter D, the mapper of mapping the $k_1$-length information sequence to the parameter a, the structure of the coset leader permutation codeword generator, the decrement counter for $k_2$-length information sequence, and the cyclic shift register with two switches.

For the mapper of mapping the $k_1$-length information sequence to the parameter a, there is a one-to-one correspondence between $2^{k_1}$ $k_1$-length information sequences and values of the parameter a in the calculation expression $L_{n,x_i} = \{a(1_{1,x_i} - x_i) + x_i | a \in Z_{n-1}, x_i \in Z_n, 1_{1,x_i} = [1 \ldots n]\}$ of the largest single fixed point subgroup; all $|L_{n,x_i}|$ coset leader permutation codewords are generated by the above calculation expression, and $2^{k_1}$ permutation codewords are selected from the $|L_{n,x_i}|$ coset leader permutation codewords to form $2^{k_1}$ coset leader permutation codewords of the constellation $\Gamma_n$, so that a $k_1$-length information sequence determines a coset leader permutation codeword of the constellation $\Gamma_n$.

In general, by comparing the above technical solution of the present inventive concept with the prior art, the present disclosure has the following beneficial effects.

In the encoding method for a (n, n(n−1), n−1) permutation group code based on coset partition proposed by the present disclosure, a one-to-one correspondence mapping between a binary sequence and a codeword is achieved by utilizing the coset characteristics, and a first permutation codeword of each code set can be obtained by a simple modulo n operation instead of a complex composition operation. After first permutation codewords of all code sets are determined, other permutation codewords in the code set can be obtained by a cyclic shift register. As a multi-ary error-correcting code class, the permutation group code has an error-correcting capability of d−1, which is twice the error-correcting capability of $\lfloor (d-1)/2 \rfloor$ of the conventional multi-ary error-correcting code class. When combined with the MFSK modulation technique, the receiver can perform demodulation by a simple non-coherent constant envelope demodulation technique. The reliability of signal transmission can be guaranteed in the interference channel where both multi-frequency noise and deep fading exist.

DETAILED DESCRIPTION OF THE EMBODIMENTS

Figures 1, 2:
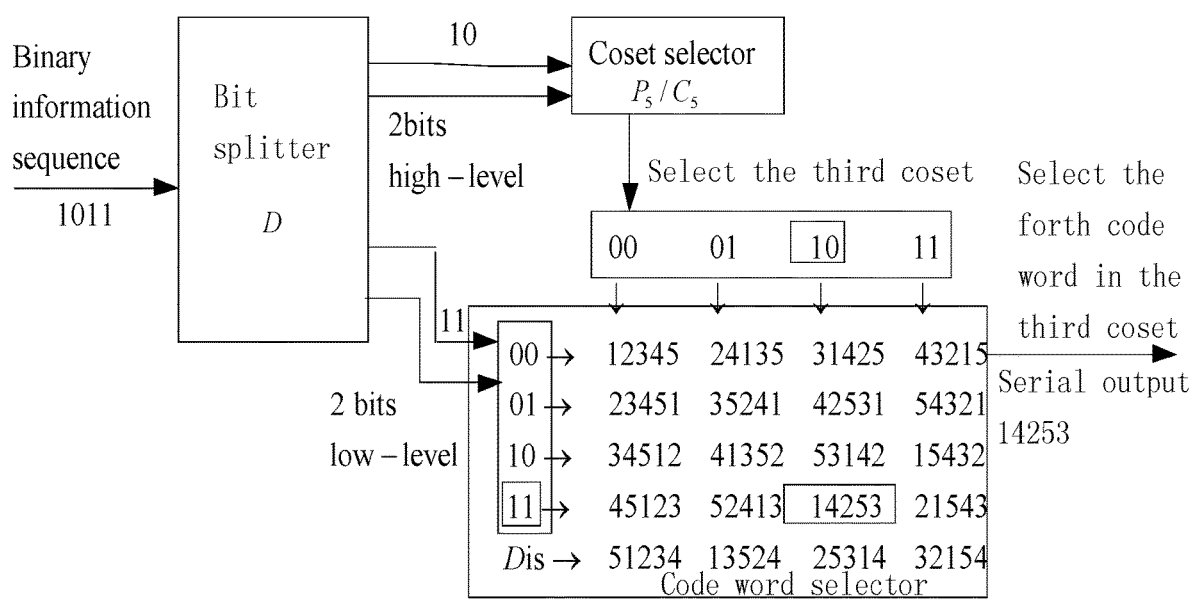
FIG. 1 is a corresponding relation diagram of a binary information sequence and a permutation codeword in an encoding method according to the present disclosure.
FIG. 2 is a schematic diagram showing an encoding process of the encoding method according to the present disclosure.

For clear understanding of the objectives, features and advantages of the present disclosure, detailed description of the present disclosure will be given below in conjunction with accompanying drawings and specific embodiments. It should be noted that the embodiments described herein are only meant to explain the present disclosure, and not to limit the scope of the present disclosure. Furthermore, the technical features related to the embodiments of the present disclosure described below can be mutually combined if they are not found to be mutually exclusive.

Basic Principles

Basic principles of a mapping encoding method of a (n, n(n−1), n−1) permutation group code based on coset partition according to the present disclosure are described below.

Assuming that code symbols can take values in a positive integer finite domain $Z_n = \{1, 2, \ldots, n\}$ or an integer finite domain $Z_n^0 = \{0, 1, 2, \ldots, n-1\}$, but a description with values mainly taken in $Z_n = \{1, 2, \ldots, n\}$ is given below, and the result also applies to the case where values are taken in $Z_n^0 = \{0, 1, 2, \ldots, n-1\}$.

Calling a set formed by all n! permutations of n elements in $Z_n$ a symmetric group $S_n = \{\pi_1, \ldots, \pi_k, \ldots, \pi_{n!}\}$, an element in $S_n$ may be represented by a permutation vector $\pi_k = [a_1 \ldots a_i \ldots a_n]$. All elements of a permutation are different and represented by $a_1, \ldots, a_i, \ldots, a_n \in Z_n$. Degree (dimension, size) of a permutation is $|\pi_k| = n$, and cardinality (order) of the symmetric group is $|S_n| = n!$. Let $\pi_0 = e = [a_1$ $a_2 \ldots a_n] = [1 2 \ldots n]$ represent an identity element of the symmetric group $S_n$. A general permutation group code is defined as a subgroup of the symmetric group $S_n$, and expressed as (n, μ, d)-PGC, where n represents a code length, μ represents the maximum cardinality (maximum size) of the code set, and d represents a minimum Hamming distance between any two permutation codewords in the code set. For example, a (n, n(n−1), n−1) permutation group code is a group code with a code length of n, a cardinality of n(n−1) and a minimum Hamming distance of n−1.

Coset Partition Structure of a (n, n(n−1), n−1) Permutation Group Code

The existing published research results show that a code set $P_{n,x_i}$ of a (n, μ, d) permutation group code (n>1) can be equivalently obtained by calculating each codeword by the following three methods.

$$P_{n,x_i} = \{p_1, p_2, \ldots, p_{n(n-1)}\}_{x_i} \quad (1)$$
$$= S_n \cap \{C_n \circ L_{n,x_i}\} = S_n \cap \{\{c_i \circ l_{j,x_i}\}_{i=1}^n\}_{j=1}^{n-1}$$
$$= S_n \cap \{a(p_{1,x_i} - x_i) + x_i + b \mid a \in Z_{n-1}, x_i, b \in Z_n, p_{1,x_i} = [1 \ldots n]\} \quad (2\text{-}1)$$
$$= S_n \cap \{L_{n,x_i} + b \mid b \in Z_n\} \quad (2\text{-}2)$$
$$= S_n \cap \{(t_{r1})^{n-1} L_{n,x_i}\} = S_n \cap \{(t_{l1})^{n-1} L_{n,x_i}\} \quad (3)$$

where the expression (1) represents a first method for generating the code set $P_{n,x_i}$, indicating that the code set $P_{n,x_i}$ obtained by an operator "∘" composition operation of two smaller subgroups (i.e., a special cyclic subgroup $C_n$ with a cardinality of $|C_n|=n$, and a largest single fixed point subgroup $L_{n,x_i}$); the expressions (2-1) and (2-2) represent a second method for generating the code set $P_{n,x_i}$, indicating that each permutation codeword in the code set $P_{n,x_i}$ can be calculated by affine transformation $f_{a,b}(p_{1,x_i}) = a(p_{1,x_i} - x_i) + x_i + b$; and the expression (3) represents a third method for generating the code set $P_{n,x_i}$, indicating that $P_{n,x_i}$ can be obtained by using a cyclic-right-shift operator $(t_{rn})^{n-1}$ or an equivalent cyclic-left-shift operator $(t_{l1})^{n-1}$ to act on the largest single fixed point subgroup $L_{n,x_i}$ (that is, the cyclic shift operation is performed for n−1 times). The fixed point $x_i \in Z_n$ indicates that all permutation vectors in the largest single fixed point subgroup $L_{n,x_i}$ contain a fixed point $x_i$ and the other code elements are non-fixed points.

When n is a non-prime number, all the above-mentioned sets formed by the curly braces {•} require an intersection operation with the symmetric group $S_n$ to guarantee that each element in $P_{n,x_i}$ is a permutation vector. This is because for any non-prime number n and all $a \in Z_{n-1}$, when a does not satisfy GCD(a, n)=1, the scaling transformation $f_{a,x_i}(1_{1,x_i}) = a(1_{1,x_i} - x_i) + x_i$ cannot guarantee that all vectors in the set $L_{n,x_i} = \{a(1_{1,x_i} - x_i) + x_i | a \in Z_{n-1}, x_i, i \in Z_n, 1_{1,x_i} = [1 \ldots n]\}$ are permutation vectors, that is, $|L_{n,x_i}| < n-1$. If and only if n is a prime number, all the sets formed by the curly braces {•} can guarantee that $P_{n,x_i}$ generated by three methods all contain n(n−1) permutation codes without the need of an intersection operation with the symmetric group $S_n$, that is, $L_{n,x_i}$ is a (n, n−1, n−1) permutation group or $|L_{n,x_i}| = n-1$. GCD(a, n) represents a greatest common divisor between $a \in Z_{n-1}$ and n, and GCD(a, n)=1 indicates that $a \in Z_{n-1}$ and n are mutually exclusive.

For any n>1, in the above three methods for generating the code set $P_{n,x_i}$ of the (n, μ, d) permutation group code, the expression (3) $P_{n,x_i} = S_n \cap \{(t_{rn})^{n-1} L_{n,x_i}\} = S_n \cap \{(t_{l1})^{n-1} L_{n,x_i}\}$ has the lowest computational complexity. For the convenience of description, the code set is hereinafter calculated by $P_{n,x_i} = S_n \cap \{(t_{l1})^{n-1} L_{n,x_i}\}$. If and only if n is a prime number, the code set $P_{n,x_i}$ is a (n, n(n−1), n−1) permutation group code, and can be simplistically calculated by $P_{n,x_i} = \{(t_{rn})^{n-1} L_{n,x_i}\} = \{(t_{l1})^{n-1} L_{n,x_i}\}$.

The coset characteristics of the code set $P_{n,x_i}$ can be summarized as follows:

1) For any fixed point $x_i \in Z_n$, the code set $P_{n,x_i}$ is composed of n−1 $C_n$ cosets $C_n 1_{1,x_i}, C_n 1_{2,x_i}, \ldots, C_n 1_{n-1,x_i}$, each coset including n codewords.

2) For any fixed point $x_i \in Z_n$, the code set $P_{n,x_i}$ can also be regarded as being composed of n−1 orbits $\{(t_{l1})^{n-1} 1_{1,x_i}\}$, $\{(t_{l1})^{n-1} 1_{2,x_i}\}, \ldots, \{(t_{l1})^{n-1} 1_{n-1,x_i}\}$ or $\{(t_{l1})^{n-1} 1_{1,x_i}\}, \{(t_{rn})^{n-1} 1_{2,x_i}\}, \ldots, \{(t_{rn})^{n-1} 1_{n-1,x_i}\}$, each orbit including n codewords.

Example 1: let n=7, which is a prime number, and let a fixed point $x_i = x_7 = 7$. The computation expression of $L_{7,7}$ is $L_{7,7} = \{a 1_{1,x_i} | a \in Z_6, 1_{1,x_i} = [1234567]\}$, and thus a largest single fixed point subgroup in which the point $x_7 = 7$ can be calculated as follow.

$$L_{7,7} = \begin{Bmatrix} 1 l_{1,7}, \\ 2 l_{1,7}, \\ 3 l_{1,7}, \\ 4 l_{1,7}, \\ 5 l_{1,7}, \\ 6 l_{1,7} \end{Bmatrix} = \begin{Bmatrix} l_{1,7}, \\ l_{2,7}, \\ l_{3,7}, \\ l_{4,7}, \\ l_{5,7}, \\ l_{6,7} \end{Bmatrix} = \begin{Bmatrix} 1[1234567], \\ 2[1234567], \\ 3[1234567], \\ 4[1234567], \\ 5[1234567], \\ 6[1234567] \end{Bmatrix} = \begin{Bmatrix} 1234567, \\ 2461357, \\ 3625147, \\ 4152637, \\ 5316427, \\ 6543217 \end{Bmatrix}$$

By using the (n−1=6)th powder of the cyclic-left-shift operator $(t_{l1})^6$ to act on the largest single fixed point subgroup $L_{7,7}$, the following (7,42,6) permutation group code $P_{7,7}$ can be obtained:

$$P_{7,7} = \{p_1, p_2, \ldots, p_{42}\}_7$$
$$= \{(t_{l1})^6 L_{7,7}\}$$
$$= \{(t_{l1})^6 l_{1,7}, (t_{l1})^6 l_{2,7}, (t_{l1})^6 l_{3,7}, (t_{l1})^6 l_{4,7}, (t_{l1})^6 l_{5,7}, (t_{l1})^6 l_{6,7}\}$$
$$= \begin{Bmatrix} 1234567 & 2461357 & 3625147 & 4152637 & 5316427 & 6543217 \\ 2345671 & 4613572 & 6251473 & 1526374 & 3164275 & 5432176 \\ 3456712 & 6135724 & 2514736 & 5263741 & 1642753 & 4321765 \\ 4567123 & 1357246 & 5147362 & 2637415 & 6427531 & 3217654 \\ 5671234 & 3572461 & 1473625 & 6374152 & 4275316 & 2176543 \\ 6712345 & 5724613 & 4736251 & 3741526 & 2753164 & 1765432 \\ 7123456 & 7246135 & 7362514 & 7415263 & 7531642 & 7654321 \end{Bmatrix}$$

Example 1 indicates that the code set $P_{7,7}$ is a permutation group code with a code length of 7, a minimum distance of 6, a cardinality of 42 and an error-correcting capability of 5. In the code set $P_{7,7}$, each column is a coset, which is obtained by storing the first permutation of this column in a cyclic shift register and performing cyclic-left-shift operations for n−1=6 times. First permutations in all six cosets are provided by the largest single fixed point subgroup $L_{7,7}$, and a permutation in $L_{7,7}$ can be calculated by the scaling transformation $f_a(1_{1,x_i}) = a 1_{1,x_i}$.

So far, the codeword enumeration work in the code set of the (n, n(n−1), n−1) permutation group code has been completed by the three methods, and the coset partition structure characteristics of the code set $P_{n,x_i}$ have been described. Generally, a code having the coset partition structure characteristics is referred to as a coset code.

Encoding Structure of a General Coset Code

In the traditional coset code, a binary information sequence is actually mapped to a modulation symbol in the signal set of the constellation, and an encoding method is mainly prescribed. The code set can be regarded as a constellation with a coset partition structure, and each codeword can be regarded as a modulation symbol. A binary sequence carrying information can be mapped to a codeword in the code set by employing a subset partitioning and prescribing mapping method for all signal points (i.e., modulation symbols or codewords) in the constellation. A description of three parts of the encoder for the general coset code is given below by using the lattice and coset language.

i) An n-dimensional lattice $\Lambda$ can be seen as an infinite array of regular points in an n-dimensional space. Signal points may be taken from a finite subset of points in a translational coset $\Lambda+a$ of the lattice $\Lambda$, and a set of all possible finite signal points is called a signal constellation.

ii) A finite subset $\Lambda'$ of the lattice $\Lambda$ (i.e., a subset of points of $\Lambda$) is itself an n-dimensional sublattice. This sublattice induces a partition expressed as $\Lambda/\Lambda'$, that is, the partition $\Lambda/\Lambda'$ partitions the lattice $\Lambda$ into $|\Lambda/\Lambda'|$ cosets of $\Lambda'$, in which $|\Lambda/\Lambda'|$ represents an order of the partition, i.e., a number of the cosets. When $\Lambda$ and $\Lambda'$ are binary lattices, the order of the partition is a power of 2, expressed as $2^{k_1}$, and $k=k_1+k_2$ represents a length of the information sequence. Accordingly, this partition partitions the signal constellation into $2^{k_1}$ subsets, and each subset corresponds to a different coset in $\Lambda'$.

iii) A binary encoder C with a code rate of $k_1/(k_1+r)$ inputs $k_1$ bits per n dimensions, and outputs $k_1+r$ bits. A coset is selected from the $|\Lambda/\Lambda'|$ cosets of $\Lambda'$ by the $k_1+r$ bits, and a codeword is selected from the selected coset by the remaining uncoded $k_2$ bits. The redundancy r(C) of the encoder C is r bits per n dimensions, and the standard redundancy per two dimensions is $\rho(C)=2r(C)/n$.

The above three parts constitutes an encoding process of the general coset code, that is, mapping a k-bit information digit to a signal point (i.e., a modulation symbol) in the constellation with the coset structure characteristics. The coset code can be expressed by a symbol $\mathbb{C}\ (\Lambda/\Lambda', C)$, which represents a set of modulation symbols corresponding to all signal points in the constellation, and is also a set of all binary sequences carrying information corresponding to all signal points in the constellation. These signal points are located in modulation symbols of the cosets of $\Lambda'$, and all cosets of $\Lambda'$ can be indexed by the encoded bit sequences output by the encoder C. When the encoder C is a linear block code, $\mathbb{C}\ (\Lambda/\Lambda', C)$ is called a coset lattice code, and when the encoder C is a convolutional code, $\mathbb{C}\ (\Lambda/\Lambda', C)$ is called a trellis code.

The redundancy r(C) of the encoder C is r bits per n dimensions, and the standard redundancy per two dimensions is $\rho(C)=2r(C)/n$. The basic encoding gain of the coset code is expressed by $\gamma(\mathbb{C})$, and is defined by two basic geometric parameters: a least squared distance between two signal points in $\mathbb{C}\ (\Lambda/\Lambda', C)$, and a basic volume $V(\mathbb{C})$ per n dimensions. The volume $V(\mathbb{C})$ is related to the redundancy $r(\mathbb{C})$ of the coset code, and is equal to $2^{r(\mathbb{C})}$. The redundancy $r(\mathbb{C})$ of the coset code is equal to a sum of the redundancy r(C) of the encoder C and the redundancy $r(\Lambda)$ of the lattice $\Lambda$, i.e., $r(\mathbb{C})=r(C)+r(\Lambda)$. For a regular lattice, $r(\Lambda)=0$, and thus, $r(\mathbb{C})=r(C)+r(\Lambda)=r(C)$. Therefore, the encoding gain of the coset code is:

$$r(\mathbb{C})=d_{min}^2(\mathbb{C})/V(\mathbb{C})=2^{-\rho(C)}d_{min}^2(\mathbb{C})=2^{-2r(C)/n}d_{min}^2(\mathbb{C}).$$

Analysis of the encoding gain $r(\mathbb{C})$ reveals that the redundancy r(C) of the encoder C is always smaller than the dimension n.

Therefore, the contribution of the redundancy introduced by the encoder C to the encoding gain is to reduce the total gain by $2^{-2r(C)/n}$ times. The mapping encoding method for the (n, n(n−1), n−1) permutation group code based on coset partition proposed in the present disclosure makes full use of the natural coset partition characteristics of the permutation group code, eliminating the need for the encoder C to index $|\Lambda/\Lambda'|$ cosets in the constellation, so that the complexity of the mapping encoding system is reduced (due to the cancellation of the encoder C), and the system gain is improved by $2^{-2r(C)/n}$ times, or the reduction of the total gain caused by the encoder C is eliminated.

Technical Solution

The technical solution is partitioned into two parts. The first part covers an encoding method for a (n, n(n−1), n−1) permutation group code based on coset partition, and the second part covers a structure design of an encoder for the (n, n(n−1), n−1) permutation group code.

Part 1: An Encoding Method for a (n, n(n−1), n−1) Permutation Group Code Based on Coset Partition The present disclosure provides a mapping encoding method for a modulation constellation in a communication system, in which a k-length binary information sequence is mapped to a n-length permutation codeword in a signal constellation $\Gamma_n$ formed by the (n, n(n−1), n−1) permutation group code based on coset partition, that is, a mapping encoding method of mapping a set of $2^k$ k-length binary information sequences to a set of n(n−1) n-length permutation codewords.

When n is a prime number, a code set $P_{n,x_i}$ of a (n, n(n−1), n−1) permutation group code with a code length of n, a cardinality of n(n−1) and a minimum Hamming distance of n−1 is calculated by the following methods:

$$P_{n,x_i} = C_n L_{n,x_i} = \{c_i \circ l_j \mid c_i \in C_n, l_j \in L_{n,x_i}, i \in Z_n, j \in Z_{n-1}\} \quad (i)$$

$$= \{(t_m)^{n-1} L_{n,x_i}\} = \{(t_{l1})^{n-1} L_{n,x_i}\} \quad (ii)$$

where the code set $P_{n,x_i}$ has a cardinality of $|P_{n,x_i}|=n(n-1)$, and the largest single point subgroup $L_{n,x_i}$ is calculated by the following expression:

$$L_{n,x_i}=\{a(l_{1,x_i}-x_i)+x_i | a \in Z_{n-1}, x_i \in Z_n, l_{1,x_i}=[1 \ldots n]\} \quad (iii)$$

where the largest single fixed point subgroup has a cardinality of $|L_{n,x_i}|=n-1$; $x_i \in Z_n$ indicates that n−1 permutation codewords in the largest single fixed point subgroup $L_{n,x_i}$ all contain a fixed point $x_i$ and the other code elements are non-fixed points; and for $x_i=i$ and $x_i, i \in Z_n$, there are n fixed points, respectively corresponding to n largest single fixed point subgroups $L_{n,1}, L_{n,2}, \ldots, L_{n,n}$.

In the expression (i), $P_{n,x_i}=C_n L_{n,x_i}$ indicates that the code set $P_{n,x_i}$ is composed of n−1 cosets $C_n l_{1,x_i}, C_n l_{2,x_i}, \ldots, C_n l_{n-1,x_i}$ of $C_n$. Since in the expression (i), the composition operations "$\circ$" of the cyclic subgroup $C_n$ acting on $L_{n,x_i}$ cannot be realized by hardware, $C_n$ is replaced by a cyclic-right-shift composite operator function $(t_{rn})^{n-1}$ or a cyclicleft-shift composite operator function $(t_{l1})^{n-1}$ acting on $L_{n,x_i}$ (that is, the cyclic shift operation is performed for n−1 times). Thus, n−1 cosets of $C_n$ can be equivalently expressed as n−1 orbits $\{(t_{l1})^{n-1}1_{1,x_i}\}, \{(t_{l1})^{n-1}1_{2,x_i}\}, \ldots, \{(t_{l1})^{n-1}1_{n-1,x_i}\}$ or $\{(t_{rn})^{n-1}1_{1,x_i}\}, \{(t_{rn})^{n-1}1_{2,x_i}\}, \ldots, \{(t_{rn})^{n-1}1_{n-1,x_i}\}$.

The above equivalent operation of replacing $C_n$ with $(t_{rn})^{n-1}$ or $(t_{l1})^{n-1}$ is as follows: firstly, a coset leader or orbit leader array composed of n−1 permutation codewords is calculated by the expression (iii) for calculating $L_{n,x_i}$, and then all n(n−1) codewords of the code set $P_{n,x_i}$ are calculated by the expression (ii). For each orbit, a permutation codeword $1_{j,x_i}$ of $L_{n,x_i}$ is input to a cyclic shift register to perform n−1 cyclic-left-shift operations, equivalent to performing $\{(t_{l1})^{n-1}1_{j,x_i}\}$, or to perform n−1 cyclic-right-shift operations, equivalent to performing $\{(t_{rn})^{n-1}1_{j,x_i}\}$, thereby generating n permutation codewords. n(n−1) permutation codewords can be generated by n−1 orbits.

$2^k$ codewords are selected from n(n−1) codewords of the code set $P_{n,x_i}$ to form a signal constellation $\Gamma_n$ such that $\Gamma_n$ still has the coset characteristics, that is, $\Gamma_n$ contains $2^k$ permutation codewords, and is partitioned into $2^{k_1} \le n-1$ cosets, and each coset contains $2^{k_2} \le n$ permutation codewords, where $k=k_1+k_2$, and $2^k \le n(n-1)$. Therefore, an exact value of k is $k=\lfloor \log_2 n(n-1) \rfloor$.

An encoding method for a one-to-one mapping from the information set $H_k$ to the signal constellation $\Gamma_n$ is described as follows. There exists a mapping function $\varphi: H_k \rightarrow \Gamma_n$ defined by a function $\pi=\varphi(h)$, by which an information sequence $h=[h_1 h_2 \ldots h_k]$ in a set $H_k$ of $2^k$ k-length binary information sequences is mapped to a signal point $\pi=[a_1 a_2 \ldots a_n]$ in a signal constellation $\Gamma_n$ composed of $2^k$ n-length permutation codewords, where $\pi \in \Gamma_n$, $h \in H_k$, $h_1, h_2, \ldots, h_k \in Z_2$, $a_1, a_2, \ldots, a_n \in Z_n$.

In summary, the coset code of the (n, n(n−1), n−1) permutation group code contains the following three parts.

(A) For any prime number n>1, the code set $P_{n,x_i}$ of the permutation group code is a subgroup of the symmetric group $S_n$, and all codewords of $P_{n,x_i}$ can be regarded as discrete lattice points in an n-dimensional space. All valid signal points are selected from a subgroup or finite lattice $P_{n,x_i}$ of the symmetric group $S_n$, and a set of the valid signal points is called a signal constellation, which is expressed by $\Gamma_n \subset P_{n,x_i}$ and has a cardinality of $|\Gamma_n|=|H_k|=2^k$. In particular, $\Gamma_n$ and $P_{n,x_i}$ have the same coset structure, and cosets of $\Gamma_n$ have the same size, which is smaller than that of cosets of $P_{n,x_i}$.

(B) For a sub-lattice or sub-group $C_n$ of the code set $P_{n,x_i}$ (i.e., a subset of n(n−1) codewords of $P_{n,x_i}$), the sub-lattice $C_n$ itself is an n-dimensional lattice or a set of n-dimensional permutation vectors each containing n permutation codewords, and the sub-lattice $C_n$ induces a partition $P_{n,x_i}/C_n$ of $P_{n,x_i}$, which partitions $P_{n,x_i}$ into $|P_{n,x_i}/C_n|$ cosets of $C_n$, where $|P_{n,x_i}/C_n|=|L_{n,x_i}|=n-1$. In the signal constellation $\Gamma_n \subset P_{n,x_i}$, when a coset of $C_n$ and a lattice point of the coset are respectively indexed by two binary sequences, the order of this partition can be expressed as a power of 2, the number of cosets of this division is $2^{k_1}$, and each coset is indexed by a $k_1$-length information sequence. In each coset, the number of valid lattice points is also a power of 2, then the number of signal points contained in each coset is $2^{k_2}$, and each signal point in each coset is indexed by a $k_2$-length information sequence, where $k=k_1+k_2$.

The k-length binary information sequence is separated into two binary sequences by a bit splitter D, that is, the bit splitter D inputs a k-length binary information sequence and then outputs two independent binary sequences: a $k_1$-length information sequence corresponding to high-level $k_1$-bit of the k-length binary information sequence, and a $k_2$-length information sequence corresponding to low-level $k_2$-bit of the k-length binary information sequence. The $k_1$-length information sequence is used for indexing a coset in $|P_{n,x_i}/C_n|=|L_{n,x_i}|=n-1$ cosets, that is, for selecting a coset in the $2^{k_1}=n-1$ cosets in $\Gamma_n$. The $k_2$-length information sequence is used for indexing a codeword in the selected coset, that is, for selecting a codeword in the $2^{k_2}<n$ codewords (signal points) of the selected coset to be transmitted to a channel, thereby obtaining one-to-one mapping numberings between the $2^k$ k-length binary information sequences and the $|\Gamma_n|=|H_k|=2^k$ n-length permutation codewords of the signal constellation $\Gamma_n$.

In summary, an encoding method of mapping a k-length binary information sequence to a n-length permutation codeword is obtained by utilizing the natural coset structure of the (n, n(n−1), n−1) permutation group code, and the coset code is expressed by $\mathbb{C} (P_{n,x_i}/C_n, D)$.

Example 1: let n=5, which is a prime number, calculate $C_5=\{c_1, c_2, c_3, c_4, c_5\}=\{12345, 23451, 34512, 45123, 51234\}$, and $L_{5,5}=\{1_{1,5}, 1_{2,5}, 1_{3,5}, 1_{4,5}\}=\{a1_{1,5}|a=1,2,3,4; 1_{1,5}=[12345]\}=\{12345, 24135, 31425, 43215\}$. $P_{5,5}$ are obtained by $P_{n,x_i}=\{(t_{l1})^{n-1}L_{n,x_i}\}$.

$$P_{5,5} = \{(t_{l1})^4 l_{1,5}, (t_{l1})^4 l_{2,5}, (t_{l1})^4 l_{3,5}, (t_{l1})^4 l_{4,5}\} = \begin{Bmatrix} 12345 & 24135 & 31425 & 43215 \\ 23451 & 41352 & 14253 & 32154 \\ 34512 & 13524 & 42531 & 21543 \\ 45123 & 35241 & 25314 & 15432 \\ 51234 & 52413 & 53142 & 54321 \end{Bmatrix}$$

A binary information sequence with k=4 bits is mapped to a permutation codeword with a code length of n=5. The coset codes $\mathbb{C} (P_{5,5}/C_5; D)$ contains $|\Gamma_5|=|B_4|=2^k=2^4=16$ points, which are selected from $|P_5|=20$ points of $P_5$. In a feasible numbering method, the binary information sequence with k=4 bits is separated into a high significance digit with $k_1=2$ bits and a low significance digit with $k_2=2$ bits. $k_1=2$ bits involve four cases: 00,01,10,11, and thus, $2^{k_1}=2^2=4$ cosets $C_5l_1, C_5l_2, C_5l_3, C_5l_4$ of $C_5$ in $r_5 \subset P_5$ can be numbered. $k_2=2$ bits also involve four cases: 00,01,10,11, and thus, $2^{k_2}=2^2=4$ permutation codewords in each of the cosets $C_5l_1, C_5l_2, C_5l_3, C_5l_4$ can be numbered. Since each coset in $C_5$ contains 5 permutation codewords, the signal selector in the encoding method is required to discard one permutation codeword. FIG. 1 is a corresponding relation diagram of a binary information sequence and a permutation codeword in a mapping encoding method according to the present disclosure, in which the last one permutation codeword in each coset is discarded, and each valid constellation point is matched with a binary information sequence with k=4 bits.

FIG. 2 shows how a codeword 14253 in a numbering table in FIG. 1 is selected by the k=4-bit binary information sequence 1011. The bit splitter D separates 1011 into two parts: a 2-bit high significant digit 10 and a 2-bit low significant digit 11. The third coset $C_5l_3$ of $C_5$ in $P_{5,5}$ is selected by the 2-bit high significant digit 10, and the fourth codeword 14253 in the third coset is selected by the 2-bit low significant digit 11. An output of the encoder functions as both a serial port and a parallel port. In this way, the encoder's encoding process with an input of 1011 and an output of 14253 is achieved.

Part 2: Structural Design of an Encoder for a (n, n(n−1), n−1) Permutation Group Code Based on Coset Partition The architecture of the encoder for the (n, n(n−1), n−1) permutation group code based on coset partition has two representations, which are respectively called a basic principle architecture of the encoder and a general architecture of an execution circuit of the encoder. The architecture of the execution circuit of the encoder has three circuit execution schemes: one scheme is that all $2^k$ codewords of the signal constellation $\Gamma_n$ formed by the code set $P_{n,x_i}$ are stored in a read-only memory (ROM), and thus this encoder is called an encoder with all constellation point codewords stored in ROM, which belongs to a first scheme of the present disclosure (i.e., a $U_1$-$V_1$ type encoder described later); and other scheme is that a part of codewords ($|P_{n,x_i}/C_n|=|L_{n,x_i}|=$n−1 permutation codewords, that is, all codewords of the largest single fixed point subgroup $L_{n,x_i}$) of the signal constellation $\Gamma_n$ formed by the code set $P_{n,x_i}$ are stored in ROM and thus this encoder is called an encoder with a part of constellation point codewords stored in ROM. The latter scheme is further partitioned into two schemes, i.e., a second scheme of the present disclosure and a third scheme of the present disclosure. Specifically, in the second scheme of the present disclosure, n−1 permutation codewords of $L_{n,x_i}$ are first stored in ROM, then according to the manner of generating respective permutation codewords by a calculation expression $P_{n,x_i}=\{(t_{rn})^{n-1}L_{n,x_i}\}=\{(t_{l1})^{n-1}L_{n,x_i}\}$, a permutation codeword $l_{a,x_i}$ is first selected from the ROM storing $L_{n,x_i}$ with an address mapped by the $k_1$-length information sequence, and then stored in a cyclic-left-shift or cyclic-right-shift register, and the number of cyclic shift operations performed by the cyclic-left-shift or cyclic-right-shift register is controlled by the $k_2$-length information sequence, thereby obtaining an output codeword of the encoder. Thus, in the second scheme, the encoder can also be called an encoder in which a transmitted codeword is generated by a cyclic shift register (i.e., a $U_1$-$V_2$ type encoder described later). In the third scheme, n−1 permutation codewords of $L_{n,x_i}$ are first generated by the coset leader array generator by calculating the expression $L_{n,x_i}=\{a(l_{1,x_i}-x_i)+x_i|a\in Z_{n-1}, x_i\in Z_n, l_{1,x_i}=[1 \ldots n]\}$, then according to the manner of generating respective permutation codewords by a calculation expression $P_{n,x_i}=\{(t_{rn})^{n-1}L_{n,x_i}\}=\{(t_{l1})^{n-1}L_{n,x_i}\}$, a permutation codeword $l_{a,x_i}$ is first generated by the coset leader array generator (also called an orbit leader array generator) by calculating $l_{a,x_i}=a(l_{1,x_i}-x_i)+x_i$, where a is generated by the $k_1$-length information sequence and outputted into a cyclic-left-shift or cyclic-right-shift register, and the number of cyclic shift operations performed by the cyclic-left-shift or cyclic-right-shift register is controlled by the $k_2$-length information sequence, thereby obtaining an output codeword of the encoder (i.e., a $U_2$-$V_2$ type encoder described later).

Figure 3:
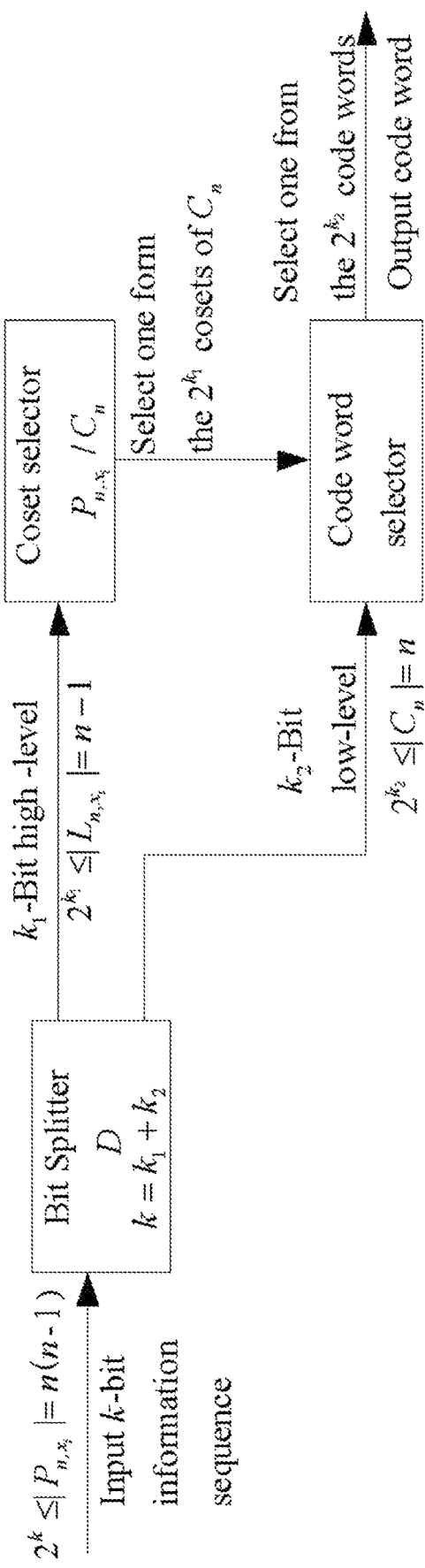
FIG. 3 is a block diagram showing the basic principle of a mapping encoder for a constellation $\Gamma_n$ according to the present disclosure.

A basic principle block diagram of the encoder for the signal constellation $\Gamma_n$ includes an information sequence splitter D, a coset selector and an intra-coset permutation codeword selector, as shown FIG. 3.

The information sequence splitter D is configured to input a k-length binary information sequence and output two binary information sequences: a $k_1$-length information sequence corresponding to high-level $k_1$-bit of the input k-length binary information sequence, and a $k_2$-length information sequence corresponding to low-level $k_2$-bit of the input k-length binary information sequence, where $k=k_1+k_2$.

The coset selector is configured to select a coset by taking $k_1$-length information sequences as indices of n−1 cosets, in which $k_1$-length information sequences respectively correspond to $2^{k_1} \leq n-1$ $k_1$-length binary index labels, and each $k_1$-length binary index label is used for selecting a coset from $2^{k_1}$ cosets. When n is a prime number, $2^{k_1}=n-1$, that is, the selection is unique.

The intra-coset permutation codeword selector is configured to select a permutation codeword by taking $k_2$-length information sequences as indices of n permutation codewords in the selected coset, in which $2^{k_2}$ $k_2$-length information sequences respectively correspond to $2^{k_2} \leq n$ $k_2$-length binary index labels, and each $k_2$-length binary index label is used for selecting a permutation codeword from selected $2^{k_2}$ permutation codewords in the selected coset. When n is a prime number, $2^{k_2}$ permutation codewords can be selected from the n permutation codewords in each coset of $C_n$ as needed to form a coset of the constellation $\Gamma_n$, and any $n-2^{k_2}$ codewords in each coset of $C_n$ are required to be discarded, that is, this selection is not unique, but has multiple solutions.

Figure 4:
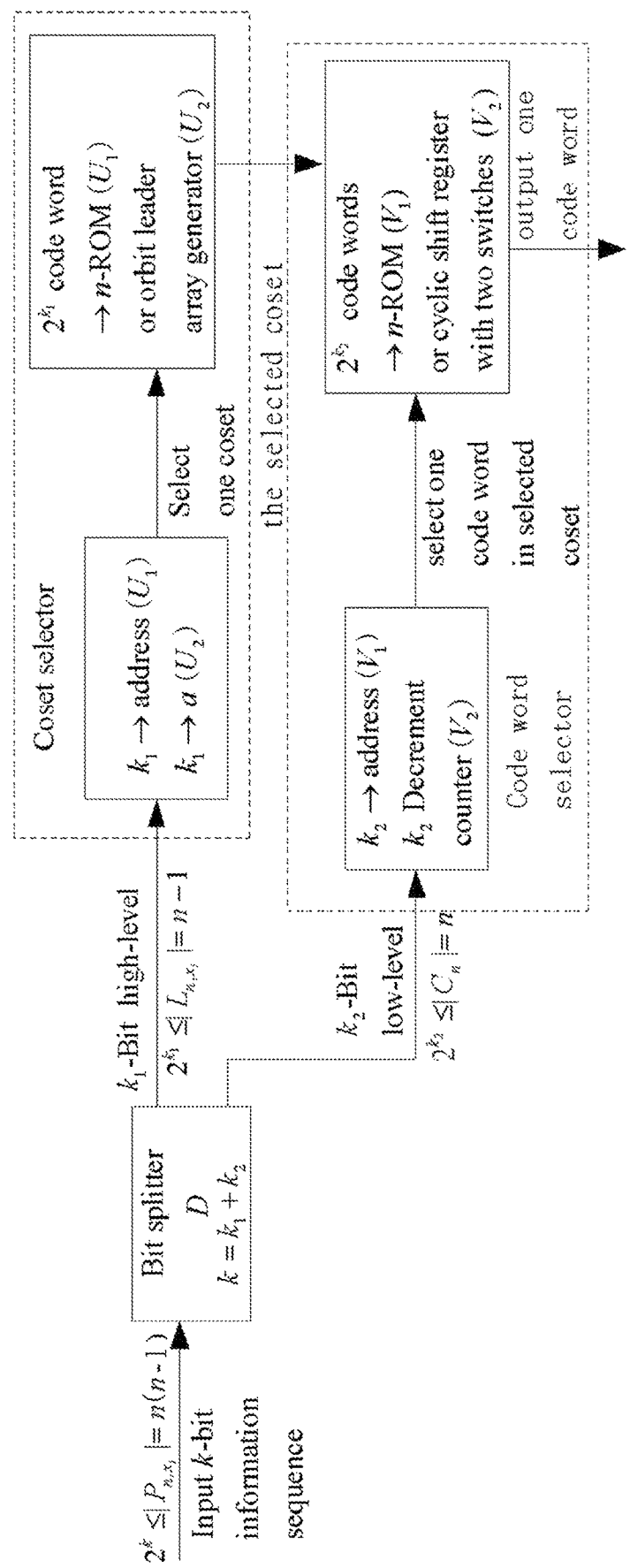
FIG. 4 shows a general architecture of the mapping encoder for the constellation $\Gamma_n$ according to the present disclosure.

A general architecture of the mapping encoder for the constellation $\Gamma_n$ includes the following circuit structure, in addition to the information sequence splitter D, as shown FIG. 4.

The coset selector has two implementation methods, each of which consists of two parts. The first implementation method is called a $U_1$ method, two parts of which include: an address generator of mapping a $k_1$-length information sequence to a coset leader permutation codeword, in which when $k_1$ is input, an address in a n-dimensional ROM is output, expressed as $k_1 \rightarrow$address; and a storage structure of $2^{k_1}$ coset leader permutation codewords in the n-dimensional ROM, expressed as $2^{k_1}$ codewords$\rightarrow$n-dimensional ROM. The second implementation method is called a $U_2$ method, two parts of which include: a mapping relationship between a $k_1$-length information sequence and a parameter a, expressed as $k_1 \rightarrow$parameter a; and an orbit leader array generator.

The intra-coset permutation codeword selector has two implementation methods, each of which consists of two parts. The first implementation method is called a $V_1$ method, two parts of which include: an address generator of mapping a $k_2$-length information sequence to an intra-coset permutation codeword, in which when $k_2$ is input, an address in a n-dimensional ROM is output, expressed as $k_2 \rightarrow$address; and a storage structure of $2^{k_2}$ intra-coset permutation codewords in the n-dimensional ROM, expressed as $2^{k_2}$ codewords$\rightarrow$n-dimensional ROM. The second implementation method is called a $V_2$ method, two parts of which include: a decrement counter for $k_2$-length information sequence; and a cyclic-left-shift or cyclic-right-shift register with two switches.

The two implementation methods $U_1$ and $U_2$ of the coset selector and the two implementation methods $V_1$ and $V_2$ of the intra-coset permutation codeword selector can be combined to form four different encoders, that is, $U_1$-$V_1$, $U_1$-$V_2$, $U_2$-$V_1$ and $U_2$-$V_2$ type encoders. Among these encoders, the $U_2$-$V_1$ type encoder doesn't actually exist due to its contradictory structure. Specifically, in the $V_1$ method, $2^{k_2}$ permutation codewords in the coset are required to be stored in the n-dimensional ROM, which requires the $2^{k_1}$ permutation codewords of the coset leader to be first stored. However, in the $U_2$ method, the $2^{k_1}$ permutation codewords of the coset leader are provided by the orbit leader array generator, but not stored in the n-dimensional ROM. Therefore, three encoder architectures can be obtained: a $U_1$-$V_1$ type encoder with all permutation codewords of the constellation $\Gamma_n$ stored in a n-dimensional ROM; a $U_1$-$V_2$ type encoder with a part of permutation codewords of the constellation $\Gamma_n$ stored in the n-dimensional ROM; and a $U_2$-$V_2$ type encoder with the constellation $\Gamma_n$ independent of n-dimensional ROM.

Figure 5:
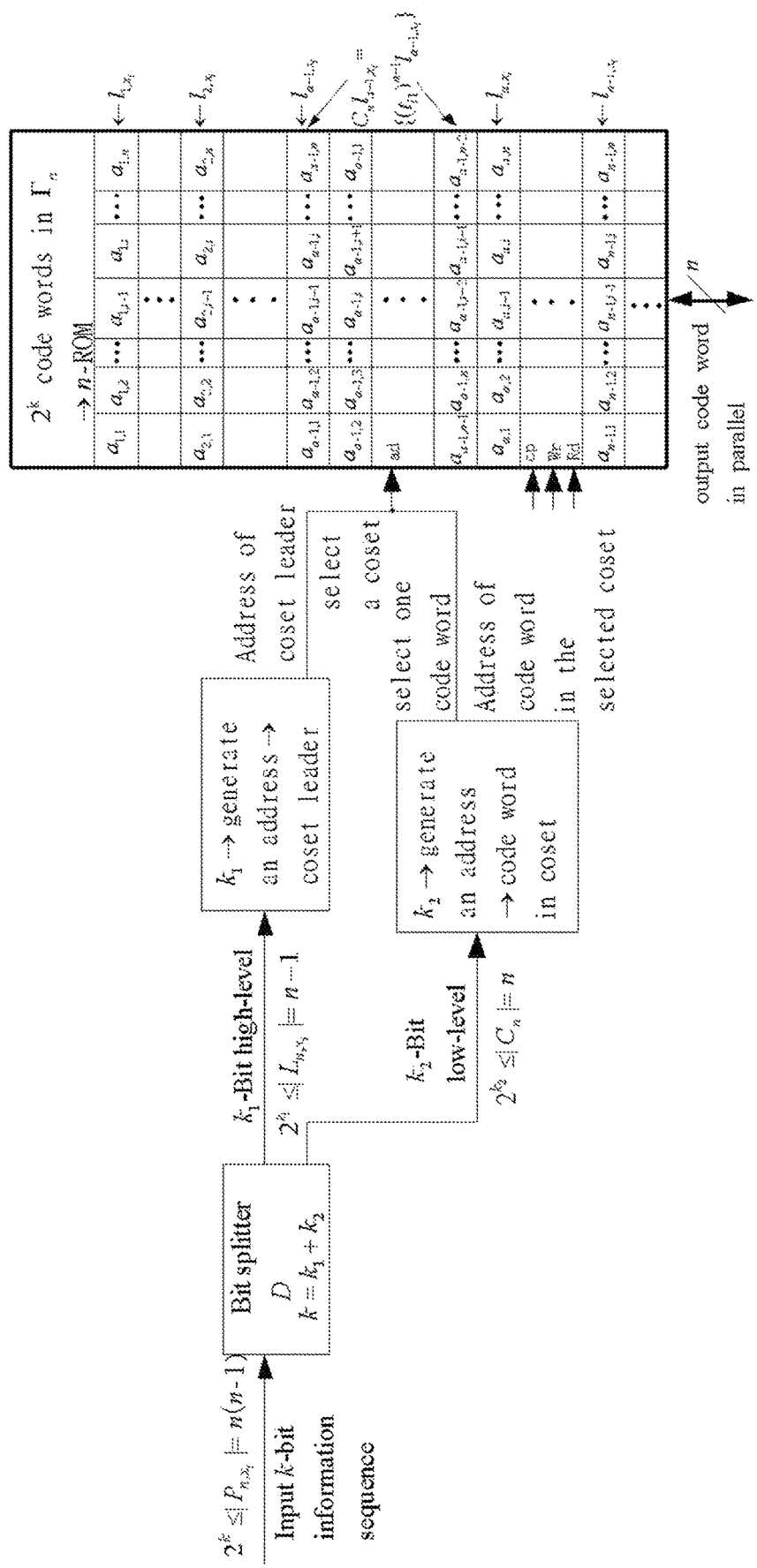
FIG. 5 shows architecture of a mapping encoder with all permutation codewords of the constellation $\Gamma_n$ stored in an n-dimensional ROM (a $U_1$-$V_1$ type encoder) according to the present disclosure.

The mapping encoder architecture with all permutation codewords of the constellation $\Gamma_n$ stored in the n-dimensional ROM ($U_1$-$V_1$ type encoder) includes a k-length information sequence splitter D, an address generator of mapping the $k_1$-length information sequence to the coset leader permutation codeword (i.e., $k_1 \rightarrow$address), an address generator of mapping the $k_2$-length information sequence to the intra-coset permutation codeword (i.e., $k_2 \rightarrow$address), and a storage structure of all $2^k$ permutation codewords of the constellation $\Gamma_n$ in the n-dimensional ROM, as shown in FIG. 5.

For the structure of the address generator of mapping the $k_1$-length information sequence to the coset leader permutation codeword, there is a one-to-one correspondence between $2^{k_1}$ $k_1$-length binary sequences carrying information and first permutation codewords (called a coset leader) of the respective cosets, in which the coset leader is determined by a largest single fixed point subgroup and thus, n−1 coset leader (also callled orbit leader) codewords are first calculated by $L_{n,x_i} = \{a(1_{,x_i} - x_i) + x_i | a \in Z_{n-1}, x_i \in Z_n, 1_{1,x_i} = [1 \ldots n]\}$, and then $2^{k_1}$ codewords are selected from the n−1 coset leader permutation codewords and stored in the n-dimensional ROM to obtain a storage address of each coset leader permutation codeword in the n-dimensional ROM. In this way, an address generator that inputs a $k_1$-length information sequence and outputs an address of a selected coset leader permutation codeword is formed. When n is a prime number, it can be guaranteed that $2^{k_1} = n-1$, so that a mapping relationship between $2^{k_1}$ $k_1$-length information sequences and storage addresses of n−1 coset leader permutation codewords in the n-dimensional ROM can be established. In this case, no coset is discarded, that is, all n−1 cosets are used in the encoder architecture.

For the structure of the address generator of mapping the $k_2$-length information sequence to the intra-coset permutation codeword, a one-to-one correspondence between $2^{k_2}$ $k_2$-length information sequence and permutation codewords in each coset is established. Generally, $2^{k_2} < n$, that is, each coset of the subgroup $C_n$ in the code set $P_{n,x_i}$ contains n codewords, each coset of the constellation $\Gamma_n$ contains $2^{k_2}$ codewords, and thus n−$2^{k_2}$ codewords in each coset of the code set $P_{n,x_i}$ must be discarded to form the constellation $\Gamma_n$ and its coset structure, in which it can be determined according to actual needs which n−$2^{k_2}$ codewords in each coset of the subgroup $C_n$ are discarded. The obtained $2^{k_2}$ codewords in each coset of the constellation $\Gamma_n$ are sequentially stored in a storage unit specified by the next storage address of a storage address of the respective coset leader permutation codeword in the n-dimensional ROM, thereby obtaining a storage address of each permutation codeword in each coset. In this way, a mapping relationship between $2^{k_2}$ $k_2$-length information sequence and storage addresses of $2^{k_2}$ codewords in each coset of the constellation $\Gamma_n$ in the n-dimensional ROM is established. Thus, an address generator that inputs a $k_2$-length information sequence and outputs an address of a selected intra-coset permutation codeword is formed.

For the storage structure of all $2^k$ permutation codewords of the constellation $\Gamma_n$ in the n-dimensional ROM, the constellation $\Gamma_n$ contains $2^k$ codewords and is partitioned into $2^{k_1}$ cosets, each coset containing $2^{k_2}$ codeword. Firstly, each codeword of the largest single fixed point subgroup is calculated, that is, $L_{n,x_i} = \{a(1_{,x_i} - x_i) + x_i | a \in Z_{n-1}, x_i \in Z_n, 1_{1,x_i} = [1 \ldots n]\}$, and thus, an address of each coset leader permutation codeword in the n-dimensional ROM is determined, and these $2^{k_1} = n-1$ addresses are stored in a register of the address generator of mapping the $k_1$-length information sequence to the coset leader permutation codeword to select respective coset leader permutation codewords. Then, $2^{k_2}$ permutation codewords are obtained by a cyclic-left-shift or cyclic-right-shift composition operator acting on each coset leader permutation codeword, that is, calculating a set $(t_{l1})^{n-1} L_{n,x_i}$ or $\{(t_{rn})^{n-1} L_{n,x_i}\}$, and stored in the n-dimensional ROM, with a storage address of the respective coset leader permutation codeword followed by storage addresses of the respective permutation codewords. Therefore, the address corresponding to the $k_2$-length information sequence is determined by the $k_2$-length information sequence itself and the coset leader address.

Figure 6:
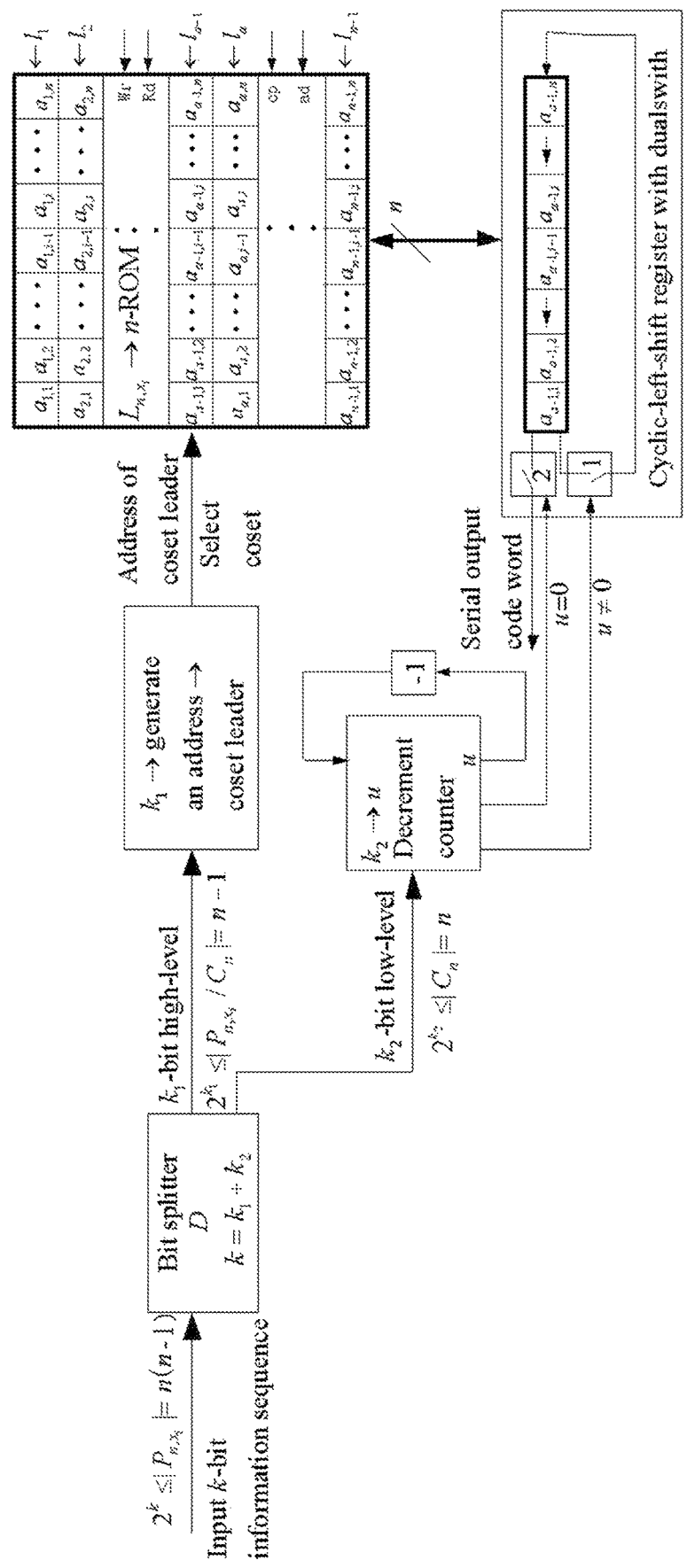
FIG. 6 shows architecture of a mapping encoder with a part of permutation codewords of the constellation $\Gamma_n$ stored in an n-dimensional ROM (a $U_1$-$V_2$ type encoder) according to the present disclosure.

The mapping encoder architecture with a part of permutation codewords of the constellation $\Gamma_n$ stored in the n-dimensional ROM ($U_1$-$V_2$ type encoder) includes a k-length information sequence splitter D, an address generator of mapping the $k_1$-length information sequence to the coset leader permutation codeword (i.e., $k_1 \rightarrow$address), a storage structure of $2^{k_1}$ coset leader permutation codewords in the n-dimensional ROM ($2^{k_1}$ codewords$\rightarrow$n-dimensional ROM), a decrement counter for the $k_2$-length information sequence, and a cyclic-left-shift or cyclic-right-shift register with two switches, as shown in FIG. 6.

Figure 7:
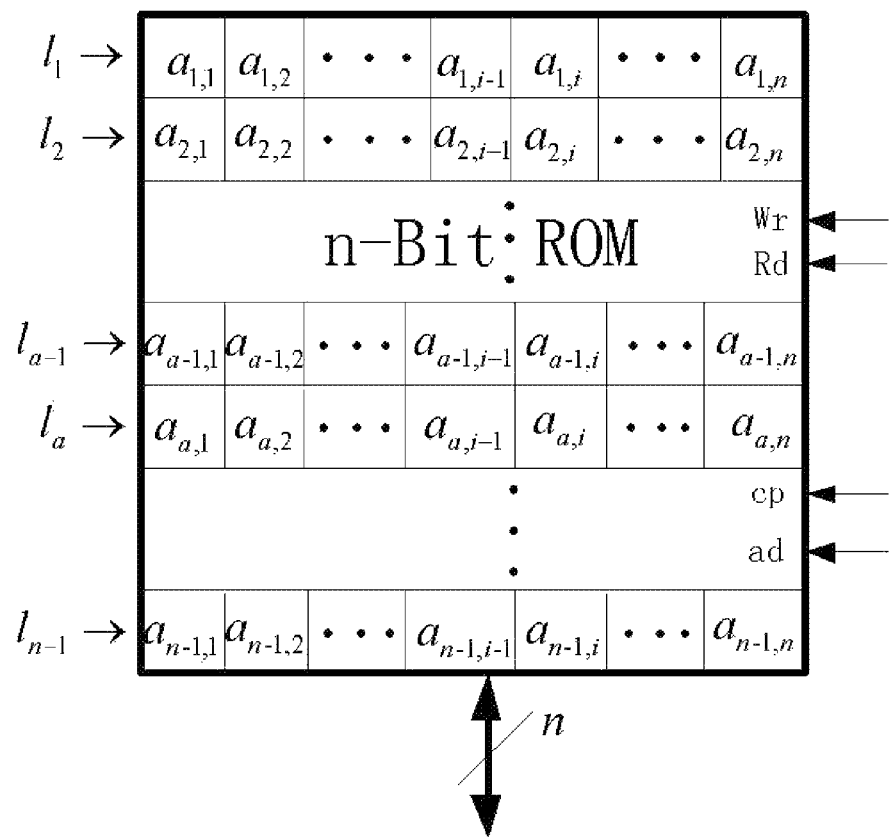
FIG. 7 shows a storage structure of $2^{k_1}$ coset leader permutation codewords in the n-dimensional ROM according to the present disclosure.

The storage structure of the $2^{k_1}$ coset leader permutation codewords in the n-dimensional ROM: as shown in FIG. 7, in the storage structure of $2^{k_1}$ permutation codewords of $L_{n,x_i}$ in the n-dimensional ROM, each line is a storage word of the n-dimensional ROM, and each permutation codeword occupies a storage word. $2^{k_1}$ permutation codewords are arbitrarily selected from all n−1 coset leader permutation codewords generated by $L_{n,x_i} = \{a(1_{,x_i} - x_i) + x_i | a \in Z_{n-1}, x_i \in Z_n, 1_{1,x_i} = [1 \ldots n]\}$, and sequentially stored in the n-dimensional ROM. When n is a prime number, the $2^{k_1} = n-1$ permutation codewords are stored in the n-dimensional ROM in an order of a=1,2, . . . , n−1. In a case of a read control signal Wr=1, upon the arrival of the cp clock pulse, the ROM outputs a permutation codeword in parallel according to a multiple-address code provided by an address input signal.

A structure of the decrement counter for the $k_2$-length information sequence: a $k_2$-length information sequence corresponding to low-level $k_2$-bit of the k-length information sequence is output to the decrement counter for the $k_2$-length information sequence, and the $k_2$-length information sequence is assigned to a u register in the decrement counter to perform a cycle-minus-one operation. When u≠0, the decrement counter outputs a high-level signal to control the switch 1 to be closed, and the switch 2 to be opened; and when u=0, the decrement counter outputs a low-level signal to control the switch 1 to be opened, and the switch 2 to be closed.

Cyclic-left-shift or cyclic-right-shift register: when the switch 1 is controlled to be closed, the cyclic shift register performs a cyclic-left-shift or cyclic-right-shift operation on the permutation codeword stored therein to obtain a new permutation codeword, and such cyclic shift operation is performed for $k_2$ times, until u is decremented from u≠0 to u=0 through the minus-one operation, thereby forming a decoded codeword in the cyclic shift register. Then, the switch 1 is controlled to be opened, and the switch 2 is controlled to be closed, so as to output a serial decoded codeword.

The working process of the encoder with a part of permutation codewords of the constellation $\Gamma_n$ stored in the ROM is as follows: the information sequence splitter D inputs a k-length information sequence and partitions it into a $k_1$-length information sequence corresponding to high-level $k_1$-bit and a $k_2$-length information sequence corresponding to low-level $k_2$-bit; the $k_1$-information sequence is mapped to an address of a coset leader permutation codeword in the n-dimensional ROM, and the address generator outputs the address to select the coset leader permutation codeword; the coset leader permutation codeword is input in parallel from the n-dimensional ROM to the n-dimensional cyclic shift register through a system bus, and under the control of the decrement counter for the $k_2$-length information sequence, a high-level signal is output when u≠0, so that the switch 1 is closed and the n-dimensional cyclic shift register performs a cyclic-left-shift or cyclic-right-shift operation; the cyclic-left-shift or cyclic-right-shift operation is performed once for each cycle-minus-one operation of the decrement counter, and when u is decremented 0 and a low-level signal is output, the switch 1 is opened and the switch 2 is closed, so that the cyclic shift register stops the cyclic-left-shift or cyclic-right-shift operation, but performs a left-shift-output operation to serially output a decoded codeword.

Figure 8:
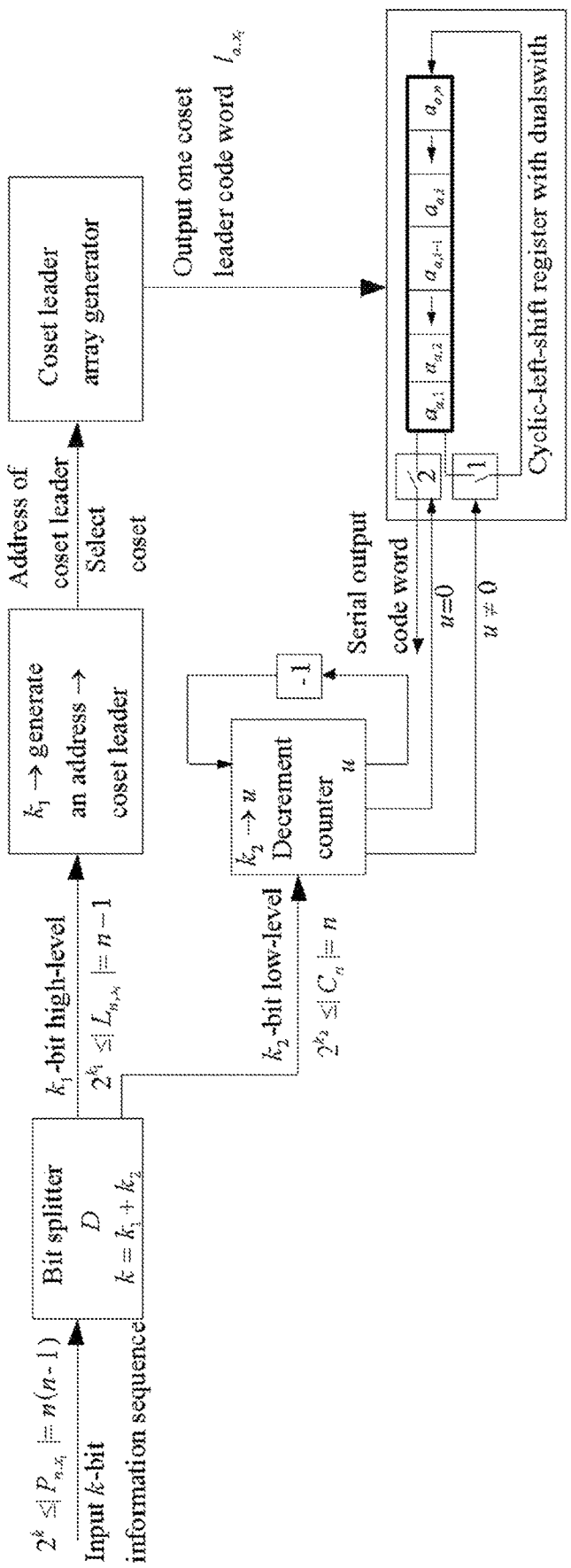
FIG. 8 shows architecture of a mapping encoder with the constellation $\Gamma_n$ independent of an n-dimensional ROM (a $U_2$-$V_2$ type encoder) according to the present disclosure.

The mapping encoder architecture with the constellation $\Gamma_n$ independent of n-dimensional ROM ($U_2$-$V_2$ type encoder) includes a k-length information sequence splitter D, a mapping of a $k_1$-length information sequence to a parameter a, a structure of a coset leader permutation codeword generator, a decrement counter for a $k_2$-length information sequence, and a cyclic-left-shift or cyclic-right-shift register with two switches, as shown FIG. 8.

For a mapping relationship between the $k_1$-length information sequence and the parameter a, that is, $k_1 \rightarrow$ parameter a, there is a one-to-one correspondence between $2^{k_1}$ $k_1$-length information sequences and values of the parameter a in the calculation expression $L_{n,x_i}=\{a(l_{1,x_i}-x_i)+x_i | a \in Z_{n-1}, x_i \in Z_n, l_{1,x_i}=[1 \ldots n]\}$ of the largest single fixed point subgroup. This calculation expression is used to generate all n−1 coset leader permutation codewords, and $2^{k_1}$ permutation codewords are selected from the n−1 coset leader permutation codewords to form $2^{k_1}$ coset leader permutation codewords of the constellation $\Gamma_n$, that is, $k_1 \rightarrow a$, $a \rightarrow l_{a,x_i}$, indicating that a $k_1$-length information sequence can determine a coset leader permutation codeword.

The structure of the coset leader permutation codeword generator (i.e., the orbit leader array generator) has been disclosed in a Chinese Patent entitled "CONSTRUCTION METHOD FOR (n, n(n−1), n−1) PERMUTATION GROUP CODE BASED ON COSET PARTITION AND CODEBOOK GENERATOR THEREOF" with the application No.: 201610051144.9, or a US Patent entitled "CONSTRUCTION METHOD FOR (n, n(n−1), n−1) PERMUTATION GROUP CODE BASED ON COSET PARTITION AND CODEBOOK GENERATOR THEREOF" with the application Ser. No.: 15/060,111. A $k_1$-length information sequence is mapped to a value of a, the value of a and an initial value of $(l_{1,x_i}-x_i)$ are input to the orbit leader array generator, and then the orbit leader array generator performs an operation of generating a coset leader permutation codeword according to the calculation expression $L_{n,x_i}=\{a(l_{1,x_i}-x_i)+x_i | a \in Z_{n-1}, x_i \in Z_n, l_{1,x_i}=[1 \ldots n]\}$.

The working process of the encoder independent of n-dimensional ROM is as follows: the information sequence splitter D inputs a k-length information sequence and partitions it into a $k_1$-length information sequence corresponding to high-level $k_1$-bit and a $k_2$-length information sequence corresponding to low-level $k_2$-bit. The $k_1$-length information sequence is mapped to the coset leader parameter $a \in Z_{n-1}$, and then the coset leader permutation codeword generator performs an operation of generating a codeword $1_{a,x_i} = \{a(l_{1,x_i}-x_i)+x_i\}$ when receiving an initial permutation vector $(l_{1,x_i}-x_i)$, and output a coset leader permutation codeword $l_{a,x_i}$ in parallel. The codeword $l_{a,x_i}$ is output to a cyclic-left-shift or cyclic-right-shift register with two switches. Under the control of the decrement counter for the $k_2$-length information sequence, the cyclic shift register performs an operation of generating a decoded codeword, and then serially output a decoded codeword.

It should be readily understood to those skilled in the art that the above description is only preferred embodiments of the present disclosure, and does not limit the scope of the present disclosure. Any change, equivalent substitution and modification made without departing from the spirit and scope of the present disclosure should be included within the scope of the protection of the present disclosure.

What is claimed is:

1. An encoding method for a (n, n(n−1), n−1) permutation group code in a communication modulation system, wherein the encoding method maps a k-length binary information sequence to a n-length permutation codeword in a signal constellation $\Gamma_n$ formed by the (n, n(n−1), n−1) permutation group code based on coset partition, wherein n is a code length, the encoding method comprising the following steps of:

constructing the (n, n(n−1), n−1) permutation group code, wherein when n is a prime number, the (n, n(n−1), n−1) permutation group code contains n(n−1) permutation codewords, each of the n(n−1) permutation codewords contains n code elements, a minimum Hamming distance between any two of the n(n−1) permutation codewords is n−1, and a code set $P_{n,x_i}$ of the (n, n(n−1), n−1) permutation group code is obtained by following expressions:

$$P_{n,x_i} = C_n L_{n,x_i} = \{c_i \circ l_j \mid c_i \in C_n, l_j \in L_{n,x_i}, i \in Z_n, j \in Z_{n-1}\} \quad (1)$$

$$= \{(t_m)^{n-1} L_{n,x_i}\} = \{(t_{l1})^{n-1} L_{n,x_i}\} \quad (2)$$

wherein the code set $P_{n,x_i}$ is obtained by an operator "$\circ$" composition operation of a special cyclic subgroup $C_n$ with a cardinality of $|C_n|=n$ and a largest single fixed point subgroup $L_{n,x_i}$ with a cardinality of $|L_{n,x_i}|=n-1$, $c_i$ represents an element in $C_n$, $l_j$ represents an element in $L_{n,x_i}$, $Z_n$ represents a positive integer finite domain expressed by $Z_n=\{1,2,\ldots,n\}$, $Z_{n-1}$ represents a positive integer finite domain expressed by $Z_{n-1}=\{1, 2,\ldots n-1\}$, and the code set $P_{n,x_i}$ has a cardinality of $|P_{n,x_i}|=n(n-1)$;

the largest single fixed point subgroup $L_{n,x_i}$ is obtained by an expression (3):

$$L_{n,x_i}=\{a(l_{1,x_i}-x_i)+x_i | a \in Z_{n-1}, x_i \in Z_n, l_{1,x_1}=[1\ldots n]\} \quad (3)$$

wherein when n is a prime number, the largest single fixed point subgroup has a cardinality of $|L_{n,x_i}|=n-1$; $x_i \in Z_n$ indicates that the i-th code element of each of all n−1 permutation codewords in the largest single fixed point subgroup $L_{n,x_i}$ is a fixed point, and the other code elements are non-fixed points; and for $x_i=i$ and $x_i$, $i \in Z_n$, there are n fixed points in all, respectively corresponding to n largest single fixed point subgroups $L_{n,1}, L_{n,2}, \ldots, L_{n,n} = L_n$;

$P_{n,x_i} = C_n L_{n,x_i}$ indicates that the code set $P_{n,x_i}$ is composed of n−1 cosets $C_n 1_{x_i}, C_n 1_{2,x_i}, \ldots, C_n 1_{n-1,x_i}$ of the special cyclic subgroup $C_n$; in the expression (2), the special cyclic subgroup $C_n$ is replaced by a cyclic-right-shift operator function $(t_{rn})^{n-1}$ or a cyclic-left-shift operator function $(t_{l1})^{n-1}$ to act on the largest single fixed point subgroup $L_{n,x_i}$, so that the n−1 cosets of the special cyclic subgroup $C_n$ are equivalently expressed as n−1 cyclic-left-shift orbits $\{(t_{l1})^{n-1} 1_{,x_i}\}, \{(t_{l1})^{n-1} 1_{2,x_i}, \ldots, \{(t_{l1})^{n-1} 1_{n-1,x_i}\}$ or cyclic-right-shift orbits $\{(t_{rn})^{n-1} 1_{1,x_i}\}, \ldots, \{(t_{rn})^{n-1} 1_{2,x_i}\}, \ldots, \{(t_{rn})^{n-1} 1_{n-1,x_i}\}$;

for an equivalent operation of $\{(t_{rn})^{n-1} L_{n,x_i}\}$ and $\{(t_{l1})^{n-1} L_{n,x_i}\}$ a coset leader or orbit leader array composed of the n−1 permutation codewords is first calculated by the expression (3) for calculating the largest single fixed point subgroup $L_{n,x_i}$, and then all n(n−1) permutation codewords of the code set $P_{n,x_i}$ are calculated by the expression (2); for each orbit, a permutation codeword $l_{j,x_i}$ of the largest single fixed point subgroup $L_{n,x_i}$ is input to a n-dimension cyclic shift register to perform n−1 cyclic-left-shift operations, equivalent to performing $\{(t_{l1})^{n-1} 1_{j,x_i}\}$, or to perform n−1 cyclic-right-shift operations, equivalent to performing $\{(t_{rn})^{n-1} 1_{j,x_i}\}$, thereby generating n permutation codewords; the n(n−1) permutation codewords are generated by the n−1 cyclic-left-shift orbits or cyclic-right-shift orbits;

selecting $2^k$ permutation codewords from the n(n−1) permutation codewords of the code set $P_{n,x_i}$, to form the signal constellation $\Gamma_n$ such that the signal constellation $\Gamma_n$ having coset characteristics, that is, the signal constellation $\Gamma_n$ contains the $2^k$ permutation codewords, and is partitioned into $2^{k_1}$ cosets, and each coset of the $2^{k_1}$ cosets contains $2^{k_2}$ permutation codewords, wherein $k=k_1+k_2$, $2^k \leq n(n-1)$, $2^{k_1} \leq n-1$, $2^{k_2} \leq n$, and an exact value of k is $k=\lfloor \log_2 n(n-1) \rfloor$ and satisfies $|\Gamma_n|=2^k$; and defining a mapping function $\varphi: H_k \to \Gamma_n$ by a function $\pi = \varphi(h)$, and mapping, by the mapping function $\varphi$, a k-length binary information sequence $h = [h_1 h_2 \ldots h_k]$ in a set $H_k$ of $2^k$ k-length binary information sequences to a signal point $\pi = [a_1 a_2 \ldots a_n]$ in the signal constellation $\Gamma_n$ composed of the $|\Gamma_n| = 2^k$ n-length permutation codewords, wherein $\pi \in \Gamma_n$, $h \in H_k$, $h_1, h_2, \ldots, h_k \in Z_2 = \{0,1\}$, and $a_1, a_2, \ldots, a_n \in Z_n = \{1, 2, \ldots, n\}$.

2. The encoding method according to claim 1, wherein the signal constellation $\Gamma_n$ having the coset characteristics constitutes a coset code, and in the selecting step:

for any prime number n>1, the code set $P_{n,x_i}$ is a subgroup of a symmetric group $S_n$, and all permutation codewords of the code set $P_{n,x_i}$ are positive integer vectors, which are regarded as discrete lattice points in an n-dimensional real Euclidean space $\Re^n$; all valid signal points of the signal constellation $\Gamma_n$ are selected from the code set $P_{n,x_i}$ of the symmetric group $S_n$, wherein the code set $P_{n,x_i}$ is the subgroup or finite lattice of the symmetric group $S_n$; the signal constellation $\Gamma_n$ has a cardinality of $|\Gamma_n| = |H_k| = 2^k$, and has the same coset structure as the code set $P_{n,x_i}$, and cosets of the signal constellation $\Gamma_n$ have the same size, which is smaller than the size of the code set $P_{n,x_i}$; the special cyclic subgroup $C_n$ is a sub-lattice or sub-group of the code set $P_{n,x_i}$, and for the special cyclic subgroup $C_n$ of the code set $P_{n,x_i}$, i.e., a subset of the n(n−1) permutation codewords of the code set $P_{n,x_i}$, the special cyclic subgroup $C_n$ itself is an n-dimensional lattice or a set of n-dimensional permutation vectors which are equal to the n permutation codewords, and induces a partition $P_{n,x_i}/C_n$ of the code set $P_{n,x_i}$, which partitions the code set $P_{n,x_i}$ into $|P_{n,x_i}/C_n|$ cosets of the special cyclic subgroup $C_n$, wherein $|P_{n,x_i}/C_n| = |L_{n,x_i}| = n-1$; in the signal constellation $\Gamma_n \subset P_{n,x_i}$, when all cosets of the special cyclic subgroup $C_n$ and all lattice points of the cosets are respectively indexed by two binary information sequences, the order of this partition is expressed as a power of 2, the number of the cosets of this division is $2^{k_1}$, and each coset is indexed by a $k_1$-length information sequence; in each coset, the number of valid lattice points is also a power of 2, then the number of signal points contained in each coset is $2^{k_2}$, and each signal point in each coset is indexed by a $k_2$-length information sequence, wherein $k = k_1 + k_2$ and $2^k = 2^{k_1} \cdot 2^{k_2}$;

and in the defining step:

the k-length binary information sequence is separated into two independent binary information sequences: the $k_1$-length information sequence corresponding to a high-level $k_1$-bit of the k-length binary information sequence, and the $k_2$-length information sequence corresponding to a low-level $k_2$-bit of the k-length binary information sequence; the $k_1$-length information sequence is used for indexing a coset in $|P_{n,x_i}/C_n| = |L_{n,x_i}| = n-1$ cosets, that is, for selecting a coset in the $2^{k_1} = n-1$ cosets in the signal constellation $\Gamma_n$; the $k_2$-length information sequence is used for indexing codewords in the selected coset, that is, for selecting a codeword in the $2^{k_2} < n$ codewords of the selected coset to be transmitted to a channel, thereby obtaining one-to-one mapping numberings between the $2^k$ k-length binary information sequences and the $2^k$ n-length permutation codewords of the signal constellation $\Gamma_n$.

3. An encoder for a (n, n(n−1), n−1) permutation group code in a communication modulation system, wherein the encoder maps a k-length binary information sequence to a n-length permutation codeword in a signal constellation $\Gamma_n$ formed by the (n, n(n−1), n−1) permutation group code based on coset partition, wherein n is a code length, the encoder comprising:

a k-length information sequence splitter D configured to input the k-length binary information sequence and output two information sequences: a $k_1$-length information sequence corresponding to a high-level $k_1$-bit of the input k-length binary information sequence, and a $k_2$-length information sequence corresponding to a low-level $k_2$-bit of the input k-length binary information sequence, wherein $k = k_1 + k_2$;

a coset selector configured to select a coset by taking the $k_1$-length information sequence as indices of n−1 cosets, wherein the $k_1$-length information sequence respectively corresponds to $2^{k_1}$ binary index labels, $2^{k_1} \leq n-1$, and each binary index label is used for selecting the coset from $2^{k_1}$ cosets; when n is a prime number, $2^{k_1} = n-1$; the $2^{k_1}$ cosets are as follows: $2^k$ permutation codewords are selected from n(n−1) permutation codewords of a code set $P_{n,x_i}$ of the (n, n(n−1), n−1) permutation group code to form the signal constellation $\Gamma_n$ such that the signal constellation $\Gamma_n$ having coset characteristics, that is, the signal constellation $\Gamma_n$ contains the $2^k$ permutation codewords, and is partitioned into the $2^{k_1}$ cosets, and each coset contains $2^{k_2}$ permutation codewords, wherein $k = k_1 + k_2$, $2^k \leq n(n-1)$, $2^{k_1} \leq n-1$, $2^{k_2} \leq n$, and an exact value of k is $k = \lfloor \log_2 n(n-1) \rfloor$; and an intra-coset permutation codeword selector configured to select a permutation codeword by taking the $k_2$-length information sequence as indices of n permutation codewords in the selected coset, wherein $2^{k_2}$ $k_2$-length information sequences respectively correspond to $2^{k_2}$ binary index labels for the n permutation codewords in the selected coset, $2^{k_2} \leq n$ and each binary index label is used for selecting a permutation codeword from the $2^{k_2}$ permutation codewords in the selected coset; when n is a prime number, the $2^{k_2}$ permutation codewords are selected from the n permutation codewords in a coset of a special cyclic subgroup $C_n$ as needed to form a coset of the signal constellation $\Gamma_n$, that is, any $n-2^{k_2}$ permutation codewords are required to be discarded in each coset of the special cyclic subgroup $C_n$.

4. The encoder according to claim 3, wherein the encoder is one of the following three encoders: a $U_1$-$V_1$ type encoder with all permutation codewords of the signal constellation $\Gamma_n$ stored in a first n-dimensional read only memory (ROM), a $U_1$-$V_2$ type encoder with a part of permutation codewords of the signal constellation $\Gamma_n$ stored in a second n-dimensional ROM, and a $U_2$-$V_2$ type encoder with the signal constellation $\Gamma_n$ independent of a third n-dimensional ROM, wherein $U_1$ and $U_2$ represent two different types of coset selectors, and $V_1$ and $V_2$ represent two different types of intra-coset permutation codeword selectors;

wherein a $U_1$ type coset selector includes two parts: a first address generator for mapping the $k_1$-length information sequence to a coset leader permutation codeword, wherein when $k_1$ is input, an address in a fourth n-dimensional ROM is output; and a storage structure of $2^{k_1}$ coset leader permutation codewords is stored in the fourth n-dimensional ROM;

wherein a $U_2$ type coset selector includes two parts: a mapper for mapping the $k_1$-length information sequence to a parameter a; and a coset leader permutation codeword generator;

wherein a $V_1$ type intra-coset permutation codeword selector includes two parts: a second address generator for mapping the $k_2$-length information sequence to an intra-coset permutation codeword, wherein when $k_2$ is input, an address in a fifth n-dimensional ROM is output; and a storage structure of $2^{k_2}$ intra-coset permutation codewords is stored in the fifth n-dimensional ROM; and wherein a $V_2$ type intra-coset permutation codeword selector includes two parts: a decrement counter for the $k_2$-length information sequence; and a cyclic shift register with two switches configured to perform a cyclic-left-shift or cyclic-right-shift operation.

5. The encoder according to claim 4, wherein the $U_1$-$V_1$ type encoder includes the k-length information sequence splitter D, the first address generator for mapping the $k_1$-length information sequence to the coset leader permutation codeword, the second address generator for mapping the $k_2$-length information sequence to the intra-coset permutation codeword, and a storage structure of all $2^k$ permutation codewords of the signal constellation $\Gamma_n$ is stored in the first n-dimensional ROM;

for a structure of the first address generator for mapping the $k_1$-length information sequence to the coset leader permutation codeword, there is a one-to-one correspondence between $2^{k_1}$ $k_1$-length binary information sequences and coset leaders of respective cosets; each of the coset leaders is determined by a largest single fixed point subgroup $L_{n,x_i}$, and $|L_{n,x_i}|$ coset leader permutation codewords are calculated by $L_{n,x_i} = \{a(1_{1,x_i} - x_i) + x_i | a \in Z_{n-1}, x_i \in Z_n, 1_{1,x_i} = [1 \ldots n]\}$; the $2^{k_1}$ coset leader permutation codewords are stored in the fourth n-dimensional ROM, and a storage address of each of the $2^{k_1}$ coset leader permutation codewords in the fourth n-dimensional ROM is recorded, thereby forming the first address generator; when n is a prime number, $|L_{n,x_i}| = n-1 = 2^{k_1}$; the first address generator for mapping the $k_1$-length information sequence to the coset leader permutation codeword inputs the $k_1$-length information sequence and outputs an address of a selected coset leader permutation codeword;

for a structure of the second address generator for mapping the $k_2$-length information sequence to the intra-coset permutation codeword, a one-to-one correspondence between $2^{k_2}$ $k_2$-length information sequences and permutation codewords in each coset is established; the $n-2^{k_2}$ permutation codewords are discarded in each coset of the code set $P_{n,x_i}$ to form the signal constellation $\Gamma_n$; the $2^{k_2}$ permutation codewords of each coset of the signal constellation $\Gamma_n$ are sequentially stored in the fifth n-dimensional ROM, with a storage address of the respective coset leader permutation codeword followed by storage addresses of the respective permutation codewords, and a mapping function between the $2^{k_2}$ $k_2$-length information sequences and storage addresses of the $2^{k_2}$ permutation codewords of each coset of the signal constellation $\Gamma_n$ in the fifth n-dimensional ROM is established; the second address generator for mapping the $k_2$-length information sequence to the intra-coset permutation codeword inputs the $k_2$-length information sequence and outputs an address of a selected intra-coset permutation codeword;

for a storage structure of all the $2^k$ permutation codewords of the signal constellation $\Gamma_n$ in the first n-dimensional ROM, the signal constellation $\Gamma_n$ is partitioned into the $2^{k_1}$ cosets, and each coset contains the $2^{k_2}$ permutation codewords; each permutation codeword of the largest single fixed point subgroup is calculated, and a storage address of each coset leader permutation codeword in the fourth n-dimensional ROM is determined; $2^{k_1}$ storage addresses are stored in a register of the first address generator for mapping the $k_1$-length information sequence to the coset leader permutation codeword to select respective coset leader permutation codewords; when n is a prime number, $2^{k_1} = n-1$; the $2^{k_2}$ permutation codewords in each coset of the signal constellation $\Gamma_n$ are obtained by a cyclic-left-shift or cyclic-right-shift composition operator acting on each coset leader permutation codeword, that is, calculating a set $(t_{l1})^{n-1} L_{n,x_i}\}$ or $\{(t_{rn})^{n-1} L_{n,x_i}\}$ and stored in the fifth n-dimensional ROM, with the storage address of the respective coset leader permutation codeword followed by the storage addresses of the respective permutation codewords; an address corresponding to the $k_2$-length information sequence is determined by the $k_2$-length information sequence itself and the address of the coset leader permutation codeword.

6. The encoder according to claim 4, wherein the $U_1$-$V_2$ type encoder includes the k-length information sequence splitter D, the first address generator for mapping the $k_1$-length information sequence to the coset leader permutation codeword, the storage structure of the $2^{k_1}$ coset leader permutation codewords stored in the fourth n-dimensional ROM, the decrement counter for the $k_2$-length information sequence, and the cyclic shift register with the two switches;

for the storage structure of the $2^{k_1}$ coset leader permutation codewords stored in the fourth n-dimensional ROM, when $2^{k_1}$ permutation codewords of the largest single fixed point subgroup $L_{n,x_i}$ are stored in the fourth n-dimensional ROM, each line represents a storage word in the fourth n-dimensional ROM, and each permutation codeword occupies a storage word; all of the $|L_{n,x_i}|$ coset leader permutation codewords are generated by $L_{n,x_i}=\{a(1_{1,x_i}-x_i)+x_i|a\in Z_{n-1}, x_i \in Z_n, 1_{1,x_i}=[1 \ldots n]\}$; and the $2^{k_1}$ permutation codewords are arbitrarily selected from the $|L_{n,x_i}|$ coset leader permutation codewords, and sequentially stored in the fourth n-dimensional ROM in an order of $a=1,2,\ldots,|L_{n,x_i}|$;

in a case of a read control signal Rd=1, upon the arrival of a cp clock pulse, the fourth n-dimensional ROM outputs a permutation codeword designated by an input address in parallel or serial;

for a structure of the decrement counter for the $k_2$-length information sequence, the decrement counter for the $k_2$-length information sequence inputs the $k_2$-length information sequence corresponding to the low-level $k_2$-bit of the k-length binary information sequence, and the $k_2$-length information sequence is stored to a u cyclic shift register in the decrement counter to perform a cycle-minus-one operation; when u≠0, the decrement counter outputs a high-level signal to control a switch 1 to be closed and a switch 2 to be opened; and when u=0, the decrement counter outputs a low-level signal to control the switch 1 to be opened and the switch 2 to be closed; the switch 1 is controlled to perform a cyclic shift operation of the cyclic shift register, and the switch 2 is controlled to perform a serial output operation of the cyclic shift register;

for the cyclic shift register, when the switch 1 is controlled to be closed, the cyclic shift register performs a cyclic-left-shift or cyclic-right-shift operation on a permutation codeword stored therein to obtain a new permutation codeword, and such cyclic shift operation is performed $k_2$ times, until u is decremented from u≠0 to u=0 through the cycle-minus-one operation, thereby forming a decoded codeword in the cyclic shift register; then the switch 1 is controlled to be opened, and the switch 2 is controlled to be closed, so as to serially output the decoded codeword;

for a working process of the $U_1$-$V_2$ type encoder with the part of permutation codewords of the signal constellation $\Gamma_n$ stored in the second n-dimensional ROM, the k-length information sequence splitter D inputs a k-length information sequence and partitions the k-length information sequence into the $k_1$-length information sequence corresponding to the high-level $k_1$-bit and the $k_2$-length information sequence corresponding to the low-level $k_2$-bit; the $k_1$-length information sequence is mapped to an address of a coset leader permutation codeword in the fourth n-dimensional ROM, and the first address generator outputs the address to select the coset leader permutation codeword; the selected coset leader permutation codeword is input in parallel from the fourth n-dimensional ROM to the cyclic shift register through a system bus, and under the control of the decrement counter for the $k_2$-length information sequence, the high-level signal is output in a case of u≠0, so that the switch 1 is closed and the cyclic shift register performs the cyclic-left-shift or cyclic-right-shift operation; the cyclic-left-shift or cyclic-right-shift operation is performed once for each cycle-minus-one operation of the decrement counter, until u is decremented 0, and then the low-level signal is output, so that the switch 1 is opened, the switch 2 is closed, and the cyclic shift register stops the cyclic-left-shift or cyclic-right-shift operation, but performs a left-shift-output operation to serially output the decoded codeword.

7. The encoder according to claim 4, wherein the $U_2$-$V_2$ type encoder includes: the k-length information sequence splitter D, the mapper for mapping the $k_1$-length information sequence to the parameter a, the structure of the coset leader permutation codeword generator, the decrement counter for the $k_2$-length information sequence, and the cyclic shift register with the two switches;

for the mapper for mapping the $k_1$-length information sequence to the parameter a, there is a one-to-one correspondence between the $2^{k_1}$ $k_1$-length information sequences and values of the parameter a in the calculation expression $L_{n,x_i}=\{a(1_{1,x_i}+x_i)+x_i|a\in Z_{n-1}, x_i\in Z_n, 1_{1,x_i}=[1 \ldots n]\}$ of the largest single fixed point subgroup; all of the $|L_{n,x_i}|$ coset leader permutation codewords are generated by the above calculation expression, and the $2^{k_1}$ permutation codewords are selected from the $|L_{n,x_i}|$ coset leader permutation codewords to form the $2^{k_1}$ coset leader permutation codewords of the signal constellation $\Gamma_n$, so that the $k_1$-length information sequence determines a coset leader permutation codeword of the signal constellation $\Gamma_n$;

for the working process of the $U_2$-$V_2$ type encoder, the k-length information sequence splitter D inputs the k-length information sequence and partitions the k-length information sequence into the $k_1$-length information sequence corresponding to the high-level $k_1$-bit and the $k_2$-length information sequence corresponding to the low-level $k_2$-bit; the $k_1$-length information sequence is mapped to a parameter $a\in Z_{n-1}$, and the coset leader permutation codeword generator receives an initial permutation vector $(1_{1,x_i}-x_i)$, performs an operation of generating a coset leader permutation codeword $1_{a,x_i}=a(1_{1,x_i}-x_i)+x_i$ and then outputs a selected coset leader permutation codeword $1_{a,x_i}$ in parallel; the coset leader permutation codeword $1_{a,x_i}$ is then output to the cyclic shift register with the two switches, and under the control of the decrement counter for the $k_2$-length information sequence, a codeword generation process of the encoder, and a decoded codeword is output in parallel or serial.

* * * * *